US012598787B2

(12) United States Patent
Cheng et al.

(10) Patent No.: US 12,598,787 B2
(45) Date of Patent: Apr. 7, 2026

(54) FIELD EFFECT TRANSISTOR WITH DUAL LAYER ISOLATION STRUCTURE AND METHOD

(71) Applicant: Taiwan Semiconductor Manufacturing Co., Ltd., Hsinchu (TW)

(72) Inventors: Jung-Chien Cheng, Hsinchu (TW); Kuo-Cheng Chiang, Hsinchu (TW); Shi Ning Ju, Hsinchu (TW); Guan-Lin Chen, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 554 days.

(21) Appl. No.: 18/165,853

(22) Filed: Feb. 7, 2023

(65) Prior Publication Data

US 2023/0369396 A1     Nov. 16, 2023

Related U.S. Application Data

(60) Provisional application No. 63/415,561, filed on Oct. 12, 2022, provisional application No. 63/342,008, filed on May 13, 2022.

(51) Int. Cl.
| | |
|---|---|
| *H01L 29/06* | (2006.01) |
| *H01L 21/8234* | (2006.01) |
| *H01L 29/786* | (2006.01) |
| *H10D 30/67* | (2025.01) |
| *H10D 62/10* | (2025.01) |
| *H10D 84/01* | (2025.01) |
| *H10D 84/03* | (2025.01) |

(52) U.S. Cl.
CPC ....... *H10D 62/121* (2025.01); *H10D 30/6757* (2025.01); *H10D 84/0128* (2025.01); *H10D 84/0151* (2025.01); *H10D 84/038* (2025.01)

(58) Field of Classification Search
CPC ............. H10D 62/121; H10D 30/6757; H10D 84/0128; H10D 84/0151; H10D 84/038; H10D 30/014; H10D 30/43; H10D 30/6735; H10D 62/151; H10D 64/516; H10D 84/83; H10D 84/0144; B82Y 10/00
USPC ........................................................ 257/288
See application file for complete search history.

(56) References Cited

U.S. PATENT DOCUMENTS 9,236,267 B2     1/2016   De et al.
9,502,265 B1     11/2016   Jiang et al.
(Continued)

*Primary Examiner* — Tong-Ho Kim
(74) *Attorney, Agent, or Firm* — Seed IP Law Group

(57) ABSTRACT

A device includes a stack of first semiconductor nanostructures over a substrate and a stack of second semiconductor nanostructures over the substrate. The device includes an isolation structure between the first and second semiconductor nanostructures. The isolation structure includes a core dielectric layer extending from below a top surface of the substrate to a level higher than all of the first and second semiconductor nanostructures. The isolation structure includes a shell dielectric layer surrounding a lower portion of the core dielectric layer and having a top surface lower than all of the semiconductor nanostructures. The spaces between the core dielectric layer and each of the semiconductor nanostructures can be filled with gate dielectric material or with remnants of the shell dielectric layer.

20 Claims, 33 Drawing Sheets

(56)  References Cited

U.S. PATENT DOCUMENTS

| | | | |
|---|---|---|---|
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2020/0343377 A1* | 10/2020 | Chiang | ................. H10D 30/62 |

* cited by examiner

500

FORM, BETWEEN STACKED FIRST SEMICONDUCTOR NANOSTRUCTURES OF A FIRST TRANSISTOR AND SECOND STACKED SEMICONDUCTOR NANOSTRUCTURES OF A SECOND TRANSISTOR, AN ISOLATION STRUCTURE INCLUDING A CORE DIELECTRIC LAYER HAVING A TOP SURFACE HIGHER THAN ALL OF THE FIRST AND SECOND SEMICONDUCTOR NANOSTRUCTURES AND A SHELL DIELECTRIC LAYER SURROUNDING A LOWER PORTION OF THE CORE DIELECTRIC LAYER AND HAVING A TOP SURFACE LOWER THAN ALL OF THE FIRST AND SECOND SEMICONDUCTOR NANOSTRUCTURES
— 502

FORM AN INTERFACIAL GATE DIELECTRIC LAYER IN CONTACT WITH THE FIRST AND SECOND SEMICONDUCTOR NANOSTRUCTURES
— 504

FORM A HIGH-K GATE DIELECTRIC LAYER IN CONTACT WITH THE INTERFACIAL DIELECTRIC LAYER AND SIDEWALLS OF THE CORE DIELECTRIC LAYER
— 506

FIG. 5

FIELD EFFECT TRANSISTOR WITH DUAL LAYER ISOLATION STRUCTURE AND METHOD

BACKGROUND

The semiconductor integrated circuit industry has experienced exponential growth. Technological advances in integrated circuit materials and design have produced generations of integrated circuits where each generation has smaller and more complex circuits than the previous generation. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flow diagram of a method for forming an integrated circuit, in accordance with some embodiments.

DETAILED DESCRIPTION

Figure 1A:
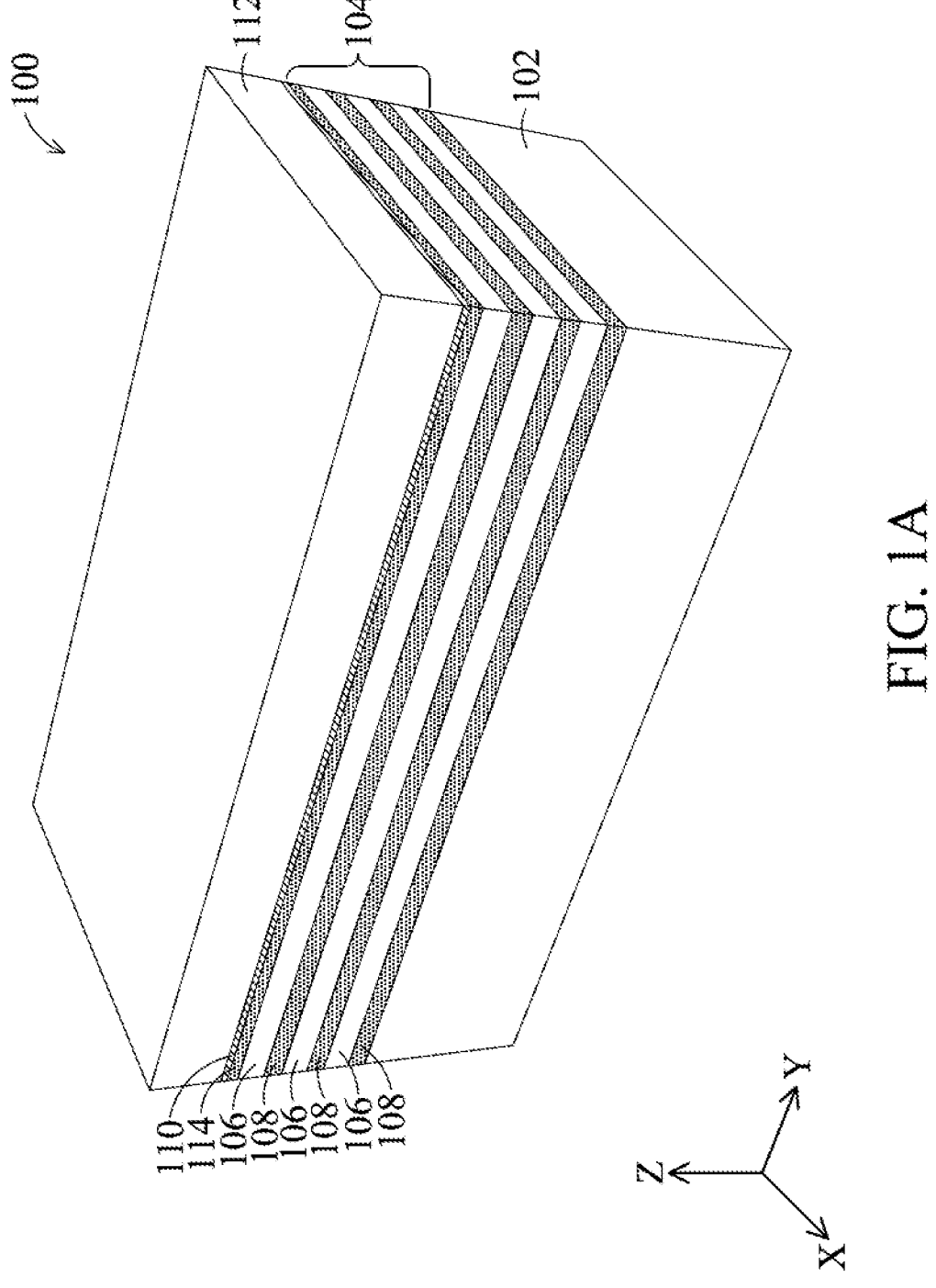
FIGS. 1A-1T are perspective, side-sectional, and plane views of an integrated circuit at intermediate stages of processing, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms.

The present disclosure is generally related to semiconductor devices, and more particularly to field-effect transistors (FETs), such as planar FETs, three-dimensional fin FETs (FinFETs), or nanostructure devices. Examples of nanostructure devices include gate-all-around (GAA) devices, nanosheet FETs (NSFETs), nanowire FETs (NWFETs), and the like. In advanced technology nodes, active area spacing between nanostructure devices is generally uniform, source/drain epitaxy structures are symmetrical, and a metal gate surrounds four sides of the nanostructures (e.g., nanosheets). Gate-drain capacitance ("Cgd") is increased due to larger metal gate endcap and increased source/drain epitaxy size.

Embodiments of the disclosure reduce active area spacing, and improve scaling of integrated circuit cell dimensions (e.g., height). In some embodiments, an isolation structure is formed between adjacent stacks of semiconductor nanostructures corresponding to channel regions of adjacent transistors. The isolation structures may have a shell dielectric layer and a core dielectric layer. Initially, the shell dielectric layer is in contact with sides of the semiconductor nanostructures. However, an etching process fully removes the shell dielectric layer from between the core dielectric layer and the semiconductor nanostructures. Subsequently, a high-K gate dielectric layer is conformally deposited on the surfaces of the semiconductor nanostructures and the core dielectric layer. The result is that the high-K gate dielectric layer entirely fills the spaces between the semiconductor nanostructures and the core dielectric layer. This can help control the profile of subsequently deposited gate metal can help prevent undesirable overlap between the gate metal and the source/drain regions. The result is improved wafer yields and integrated circuits with improved performance.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

Figure 1B:
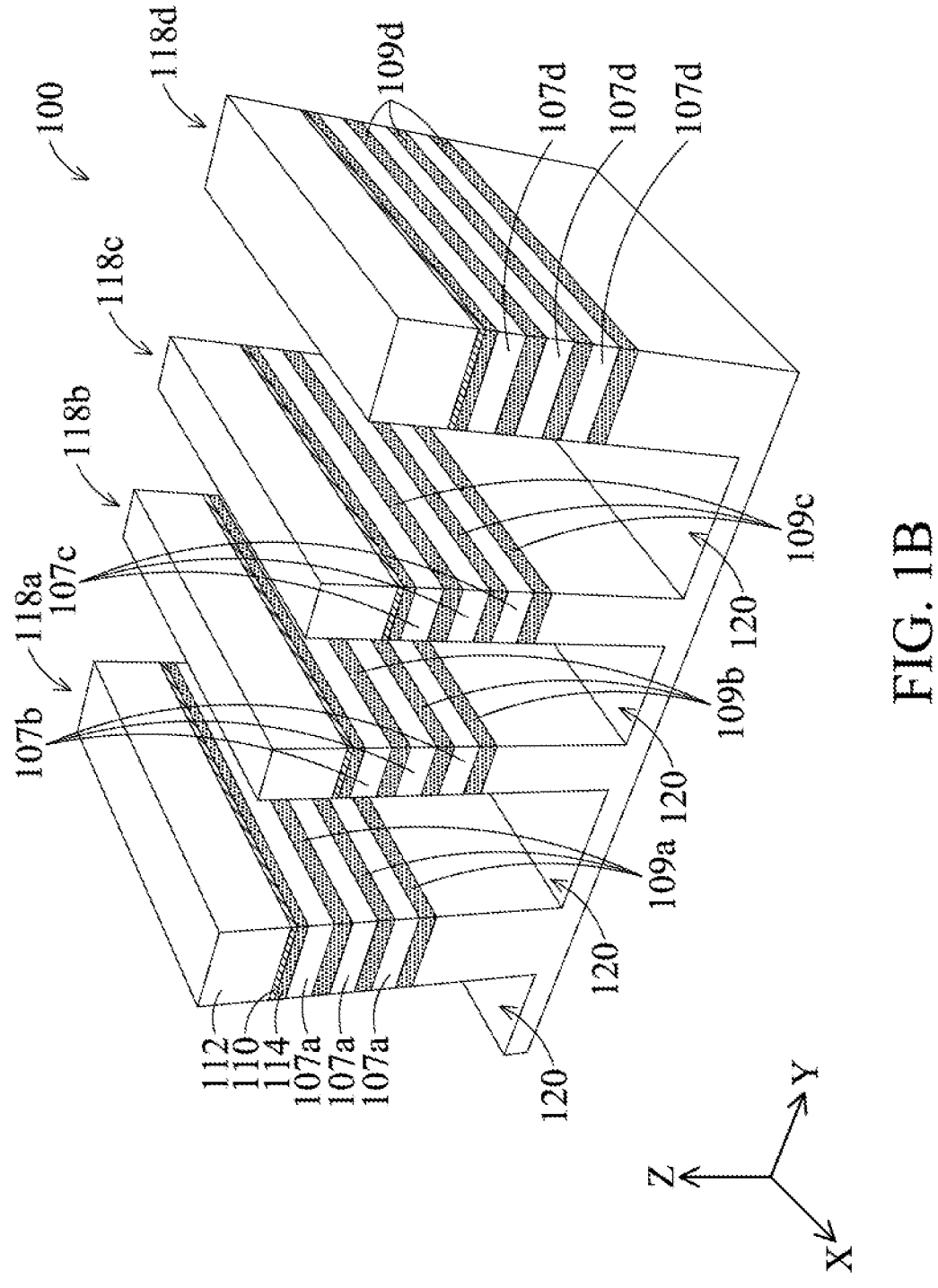
Figure 1C:
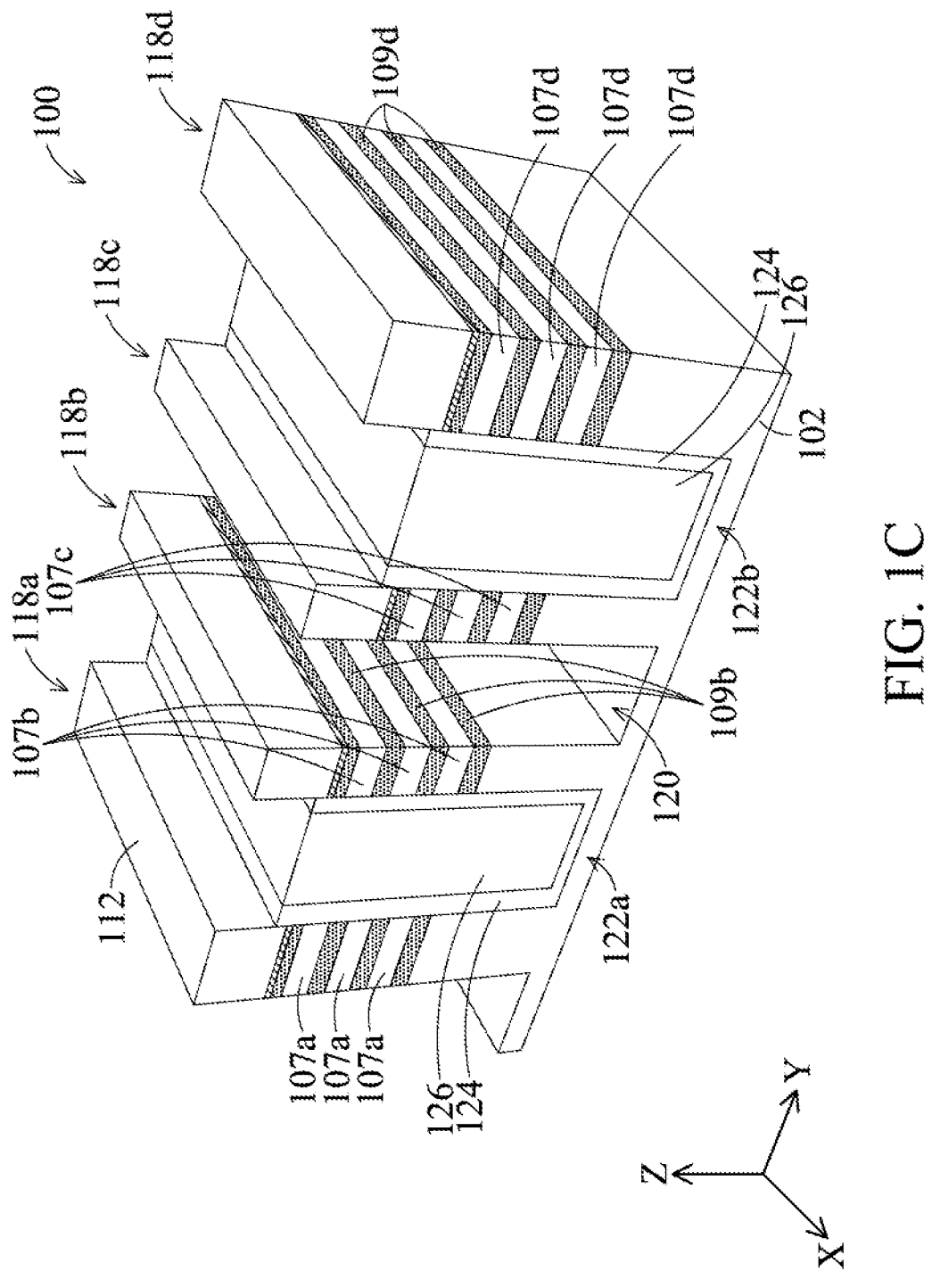
Figure 1D:
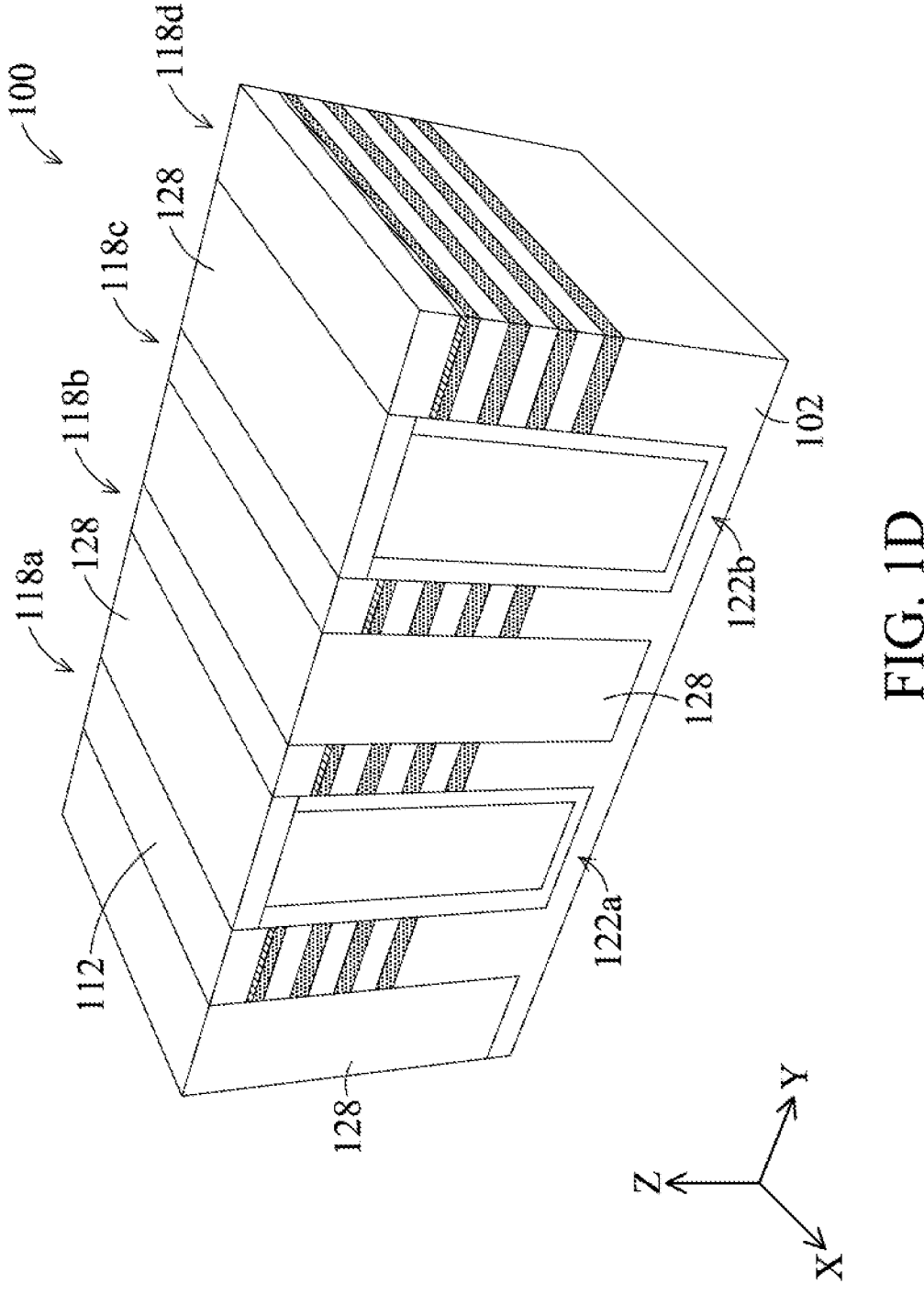
Figure 1E:
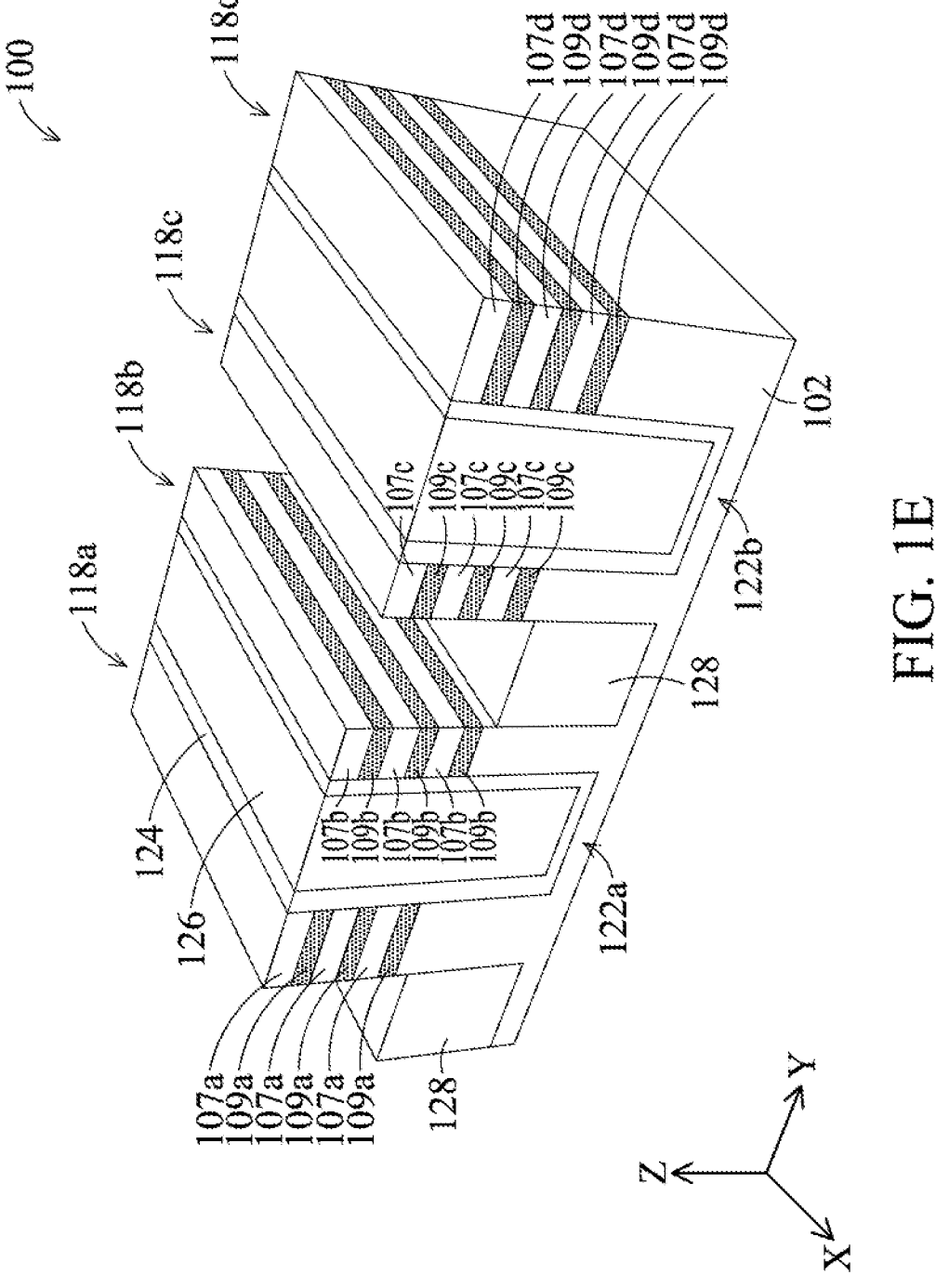
Figure 1F:
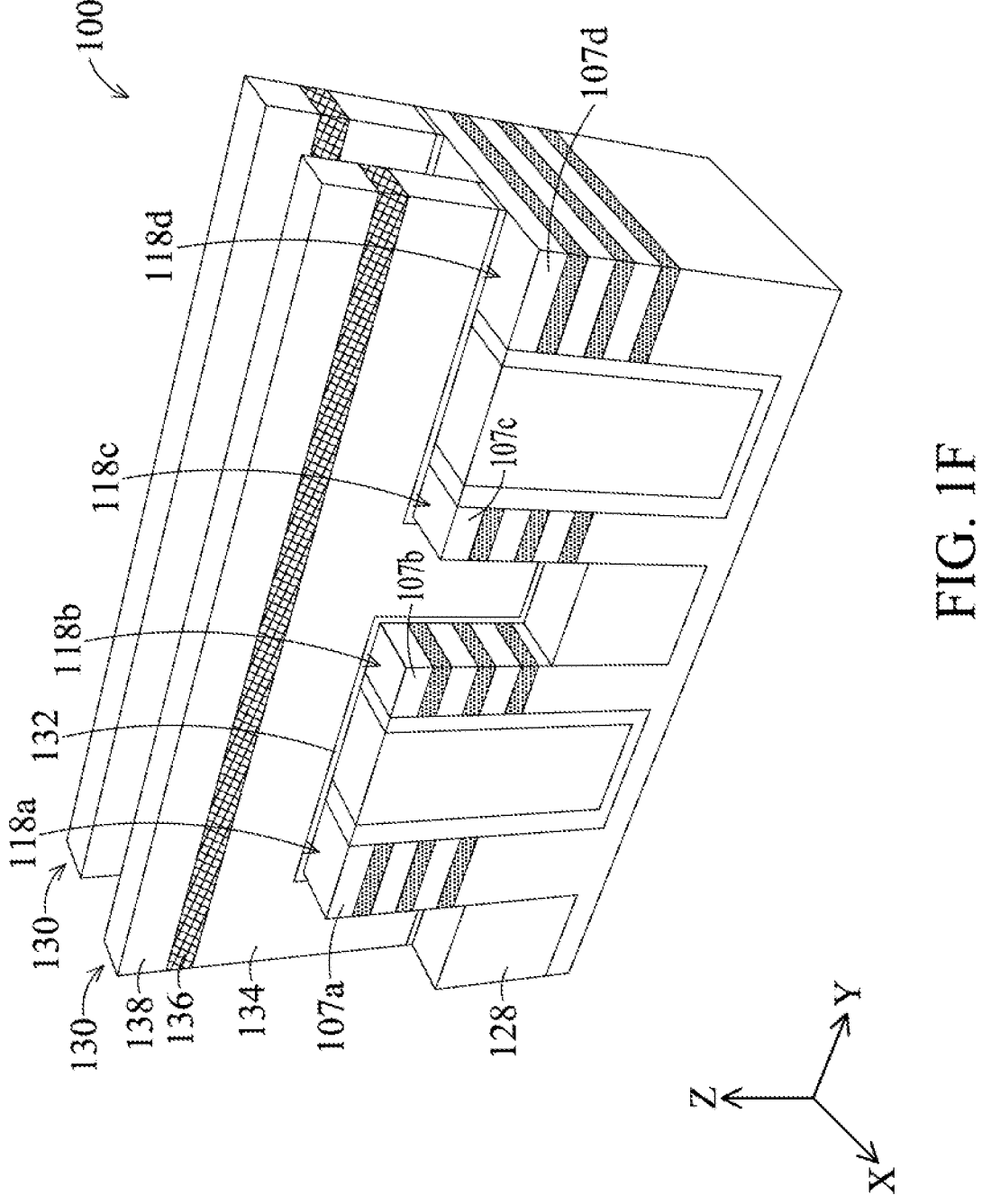
Figure 1G:
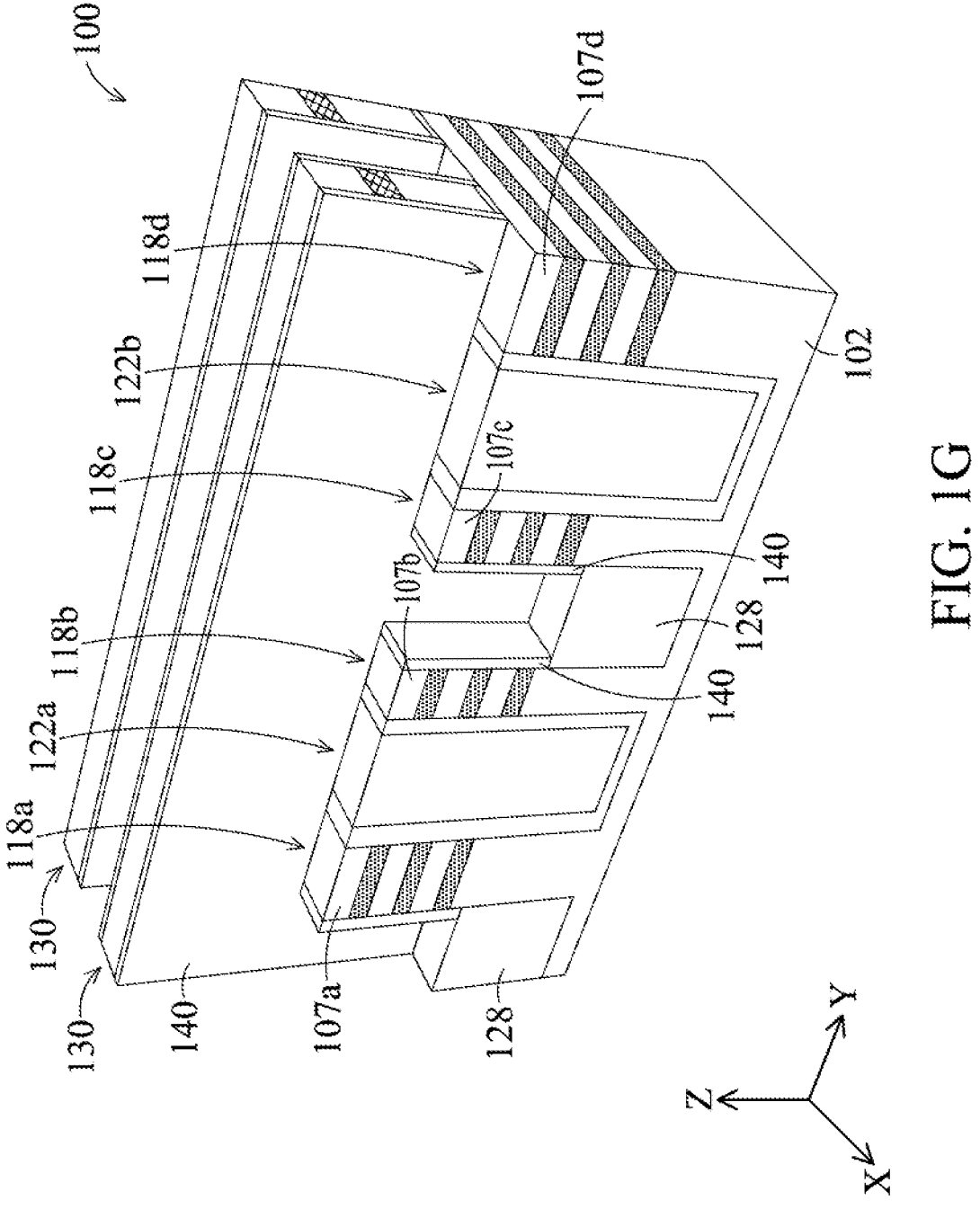
Figure 1H:
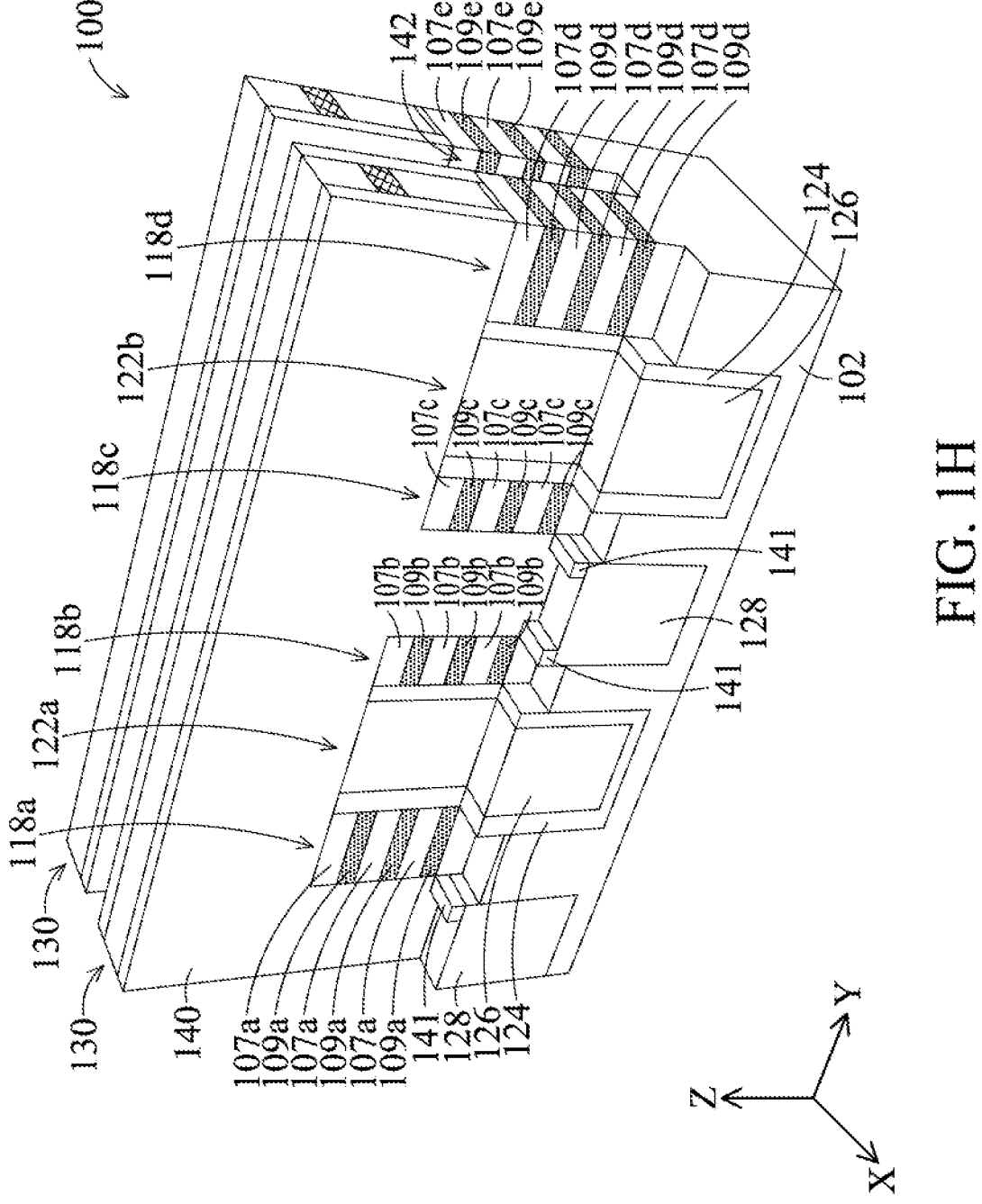
Figure 11:
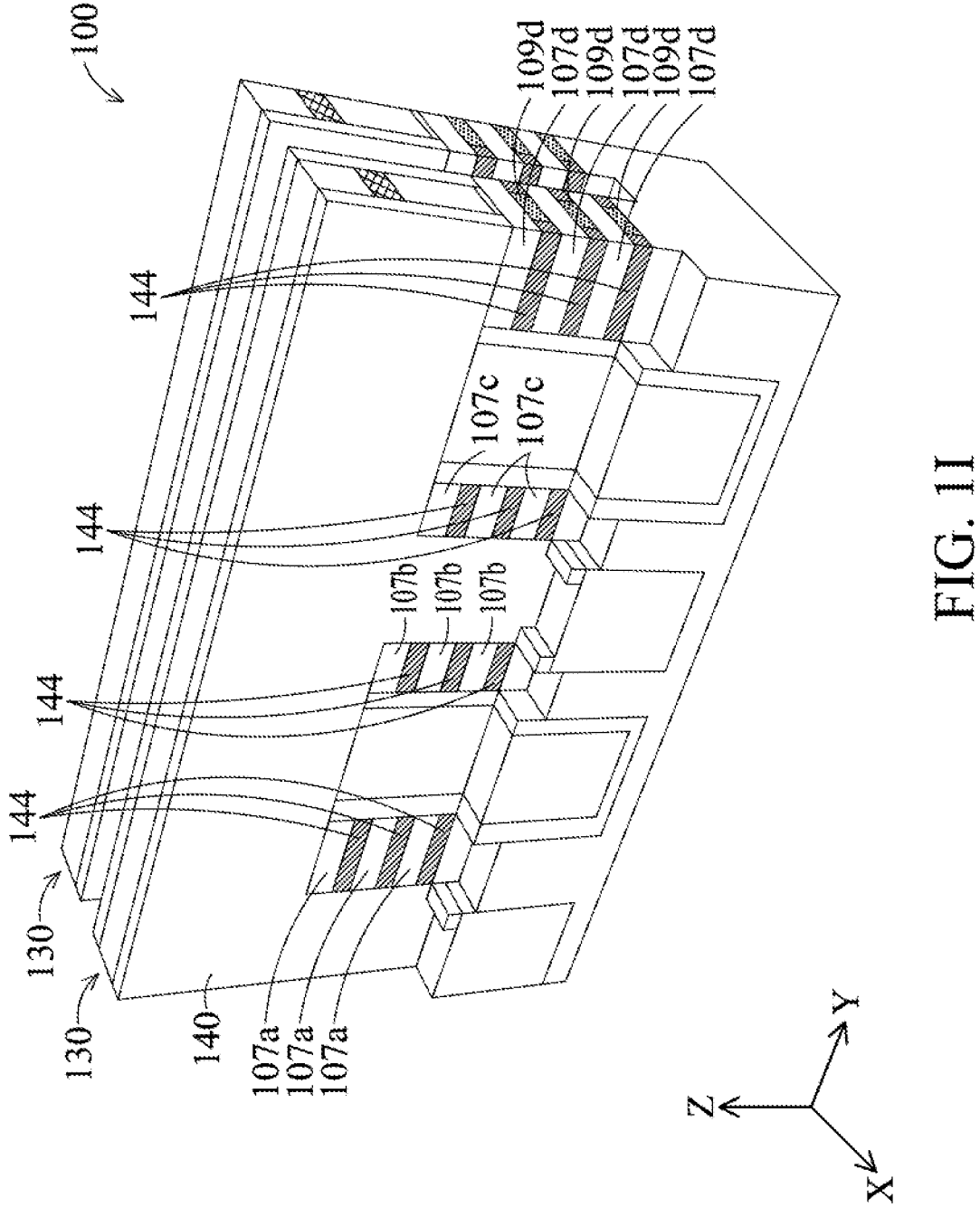
Figure 1J:
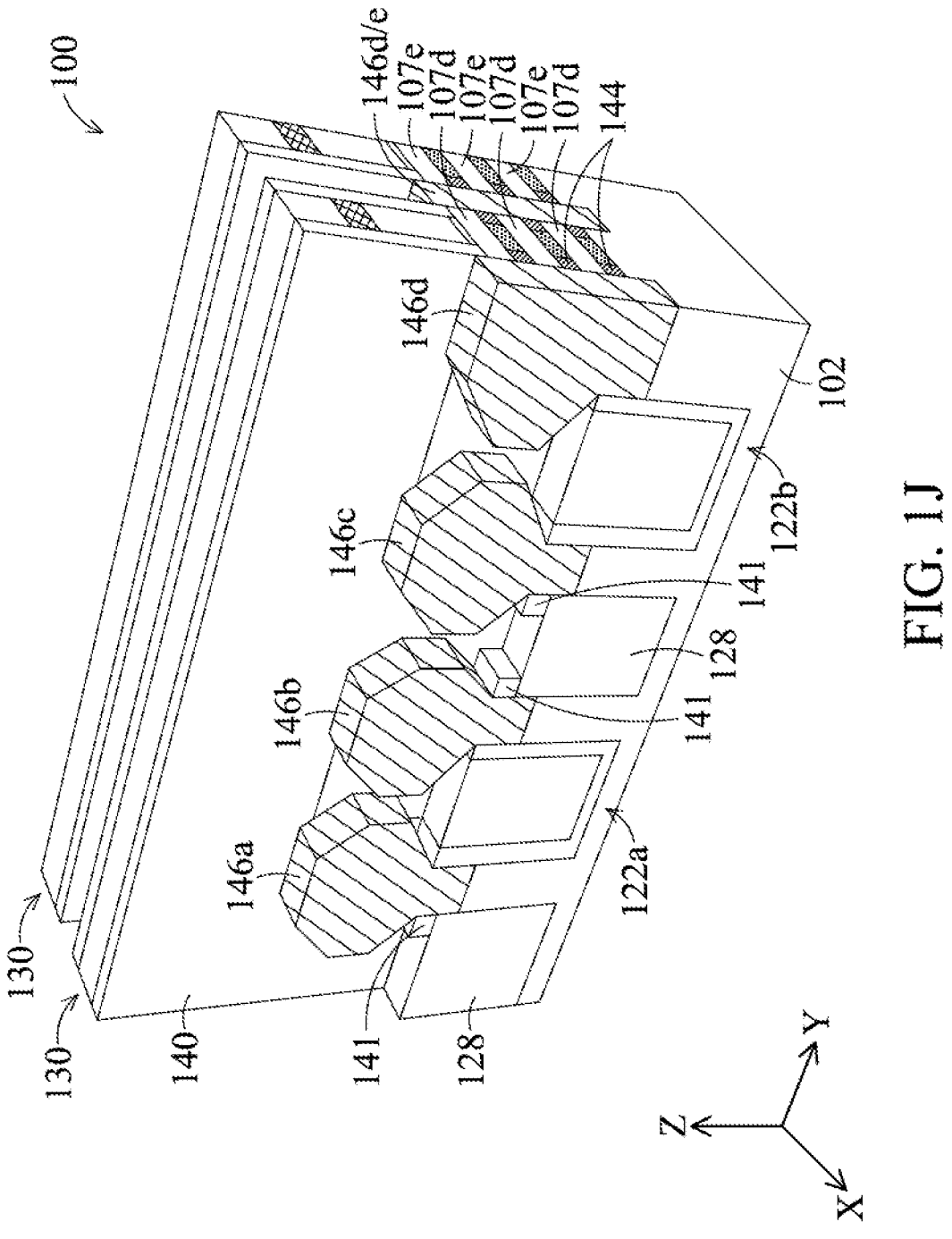
Figure 1K:
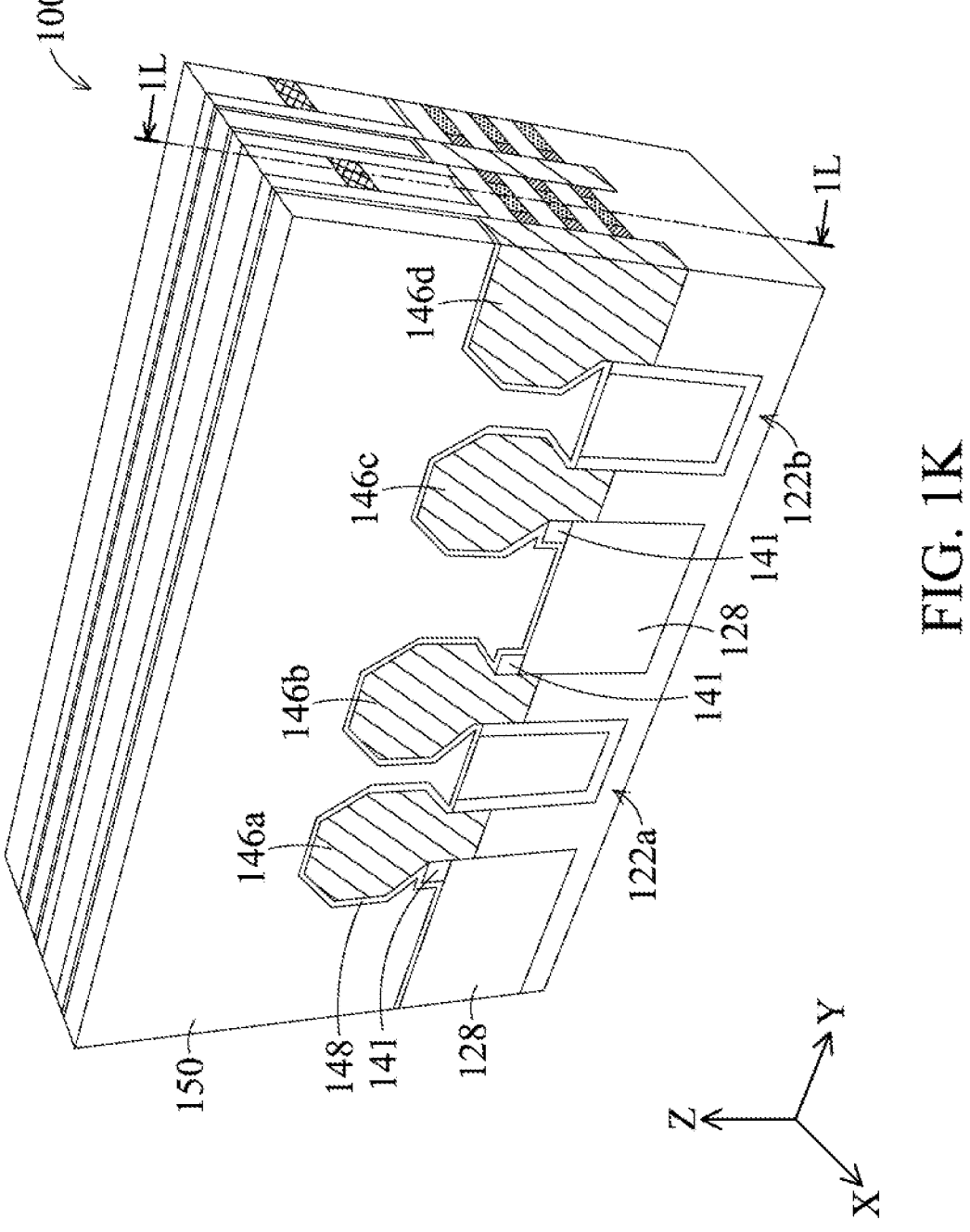
Figure 1L:
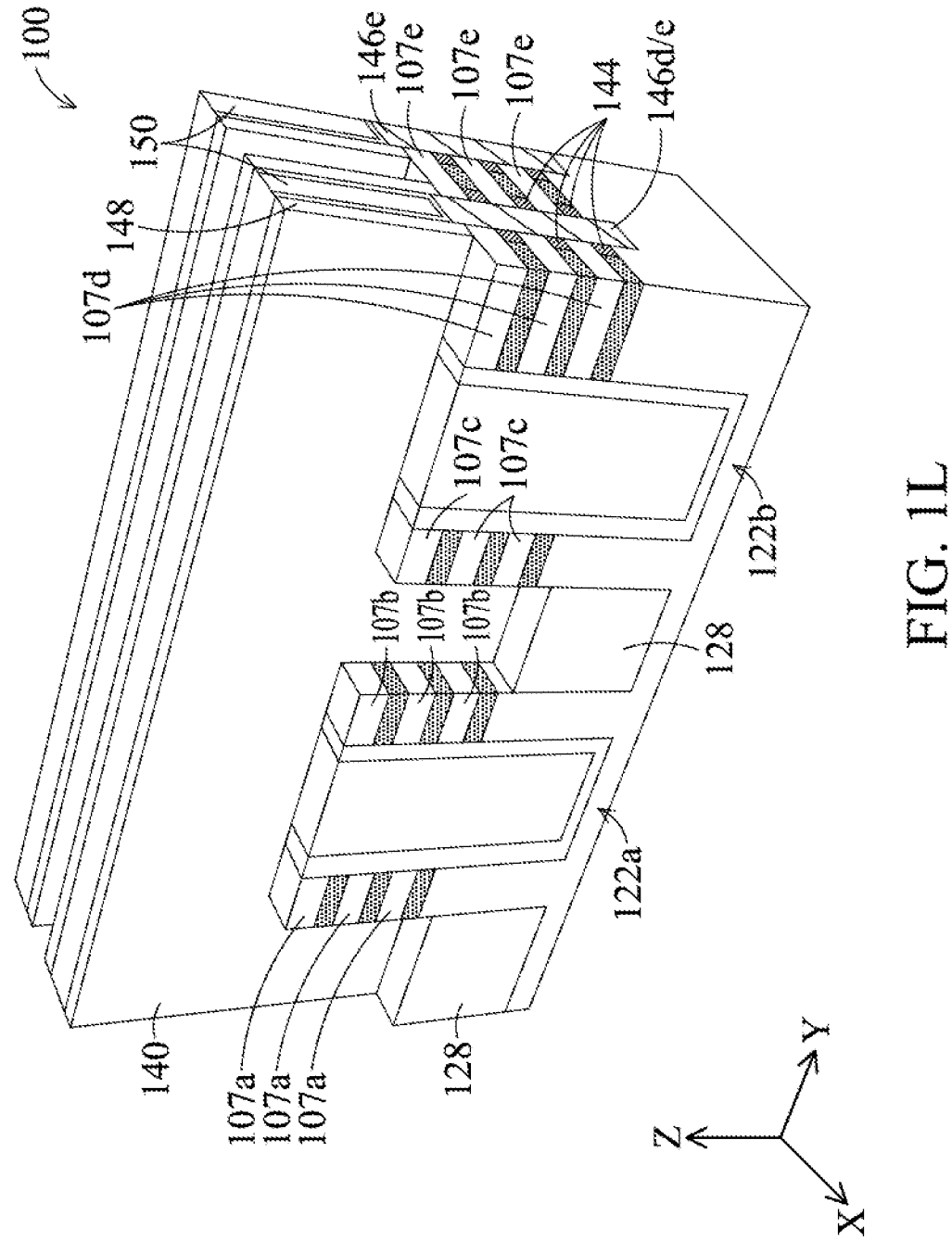
Figure 1M:
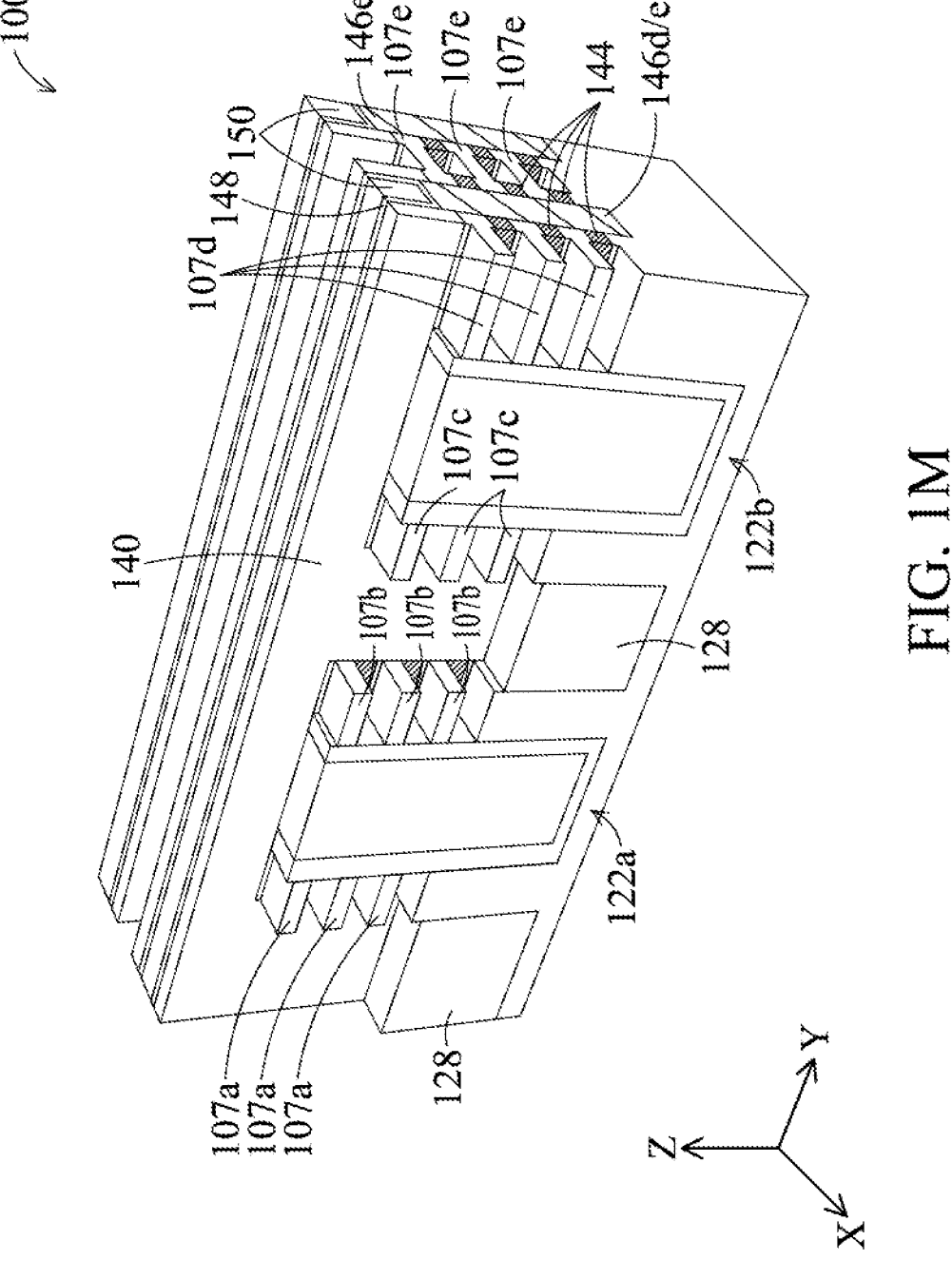
Figure 1N:
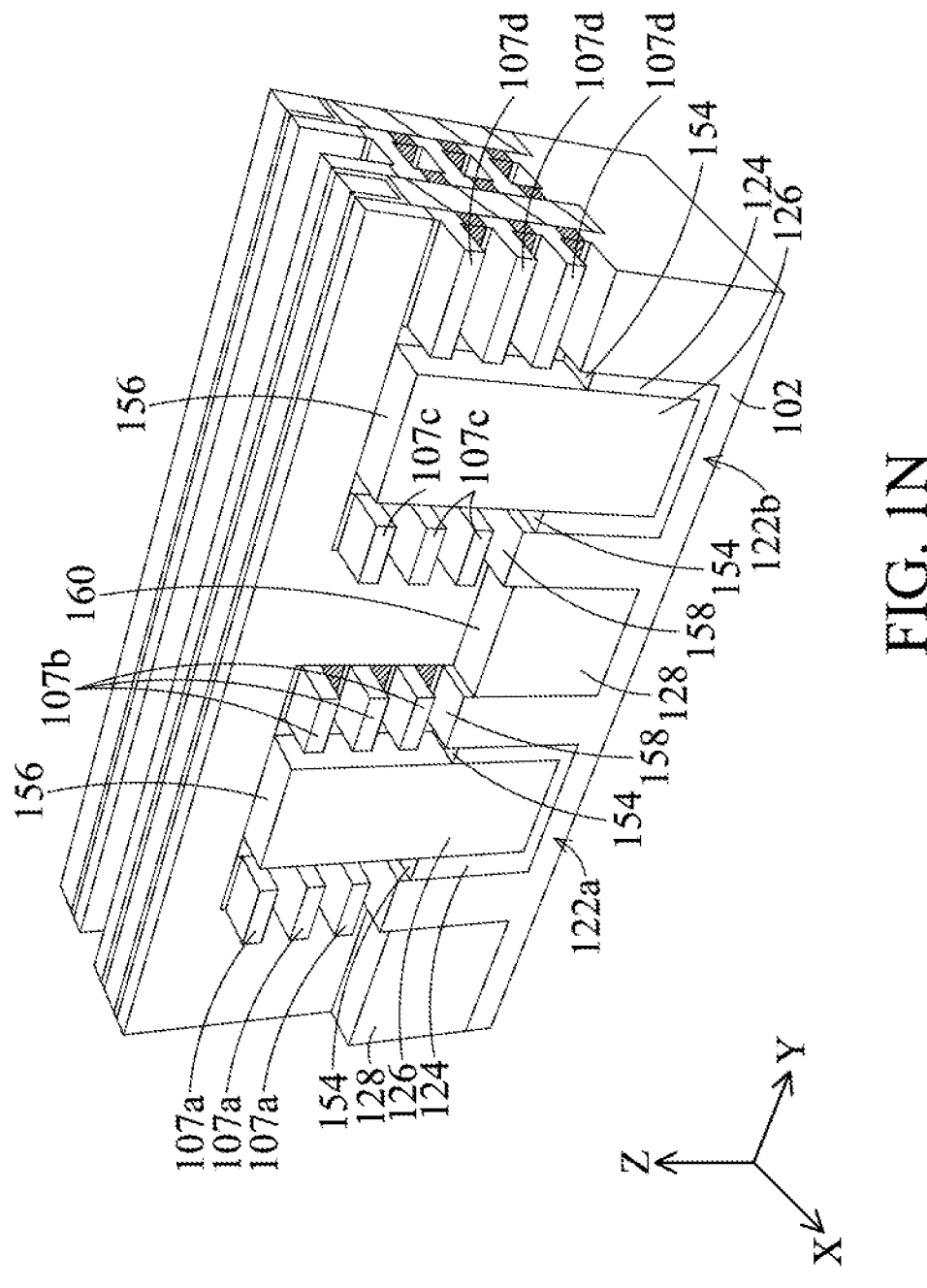
Figure 10:
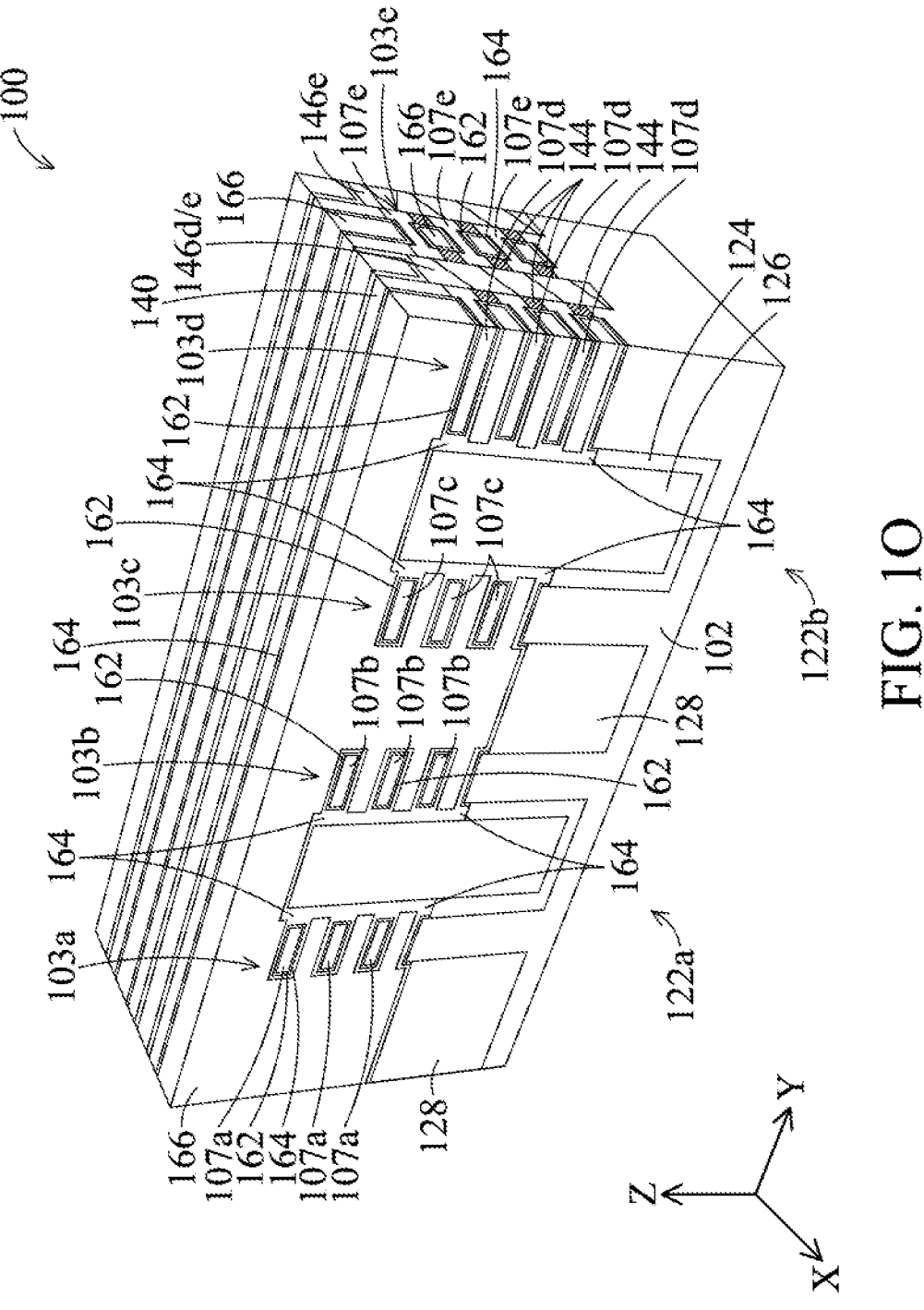
Figure 1P:
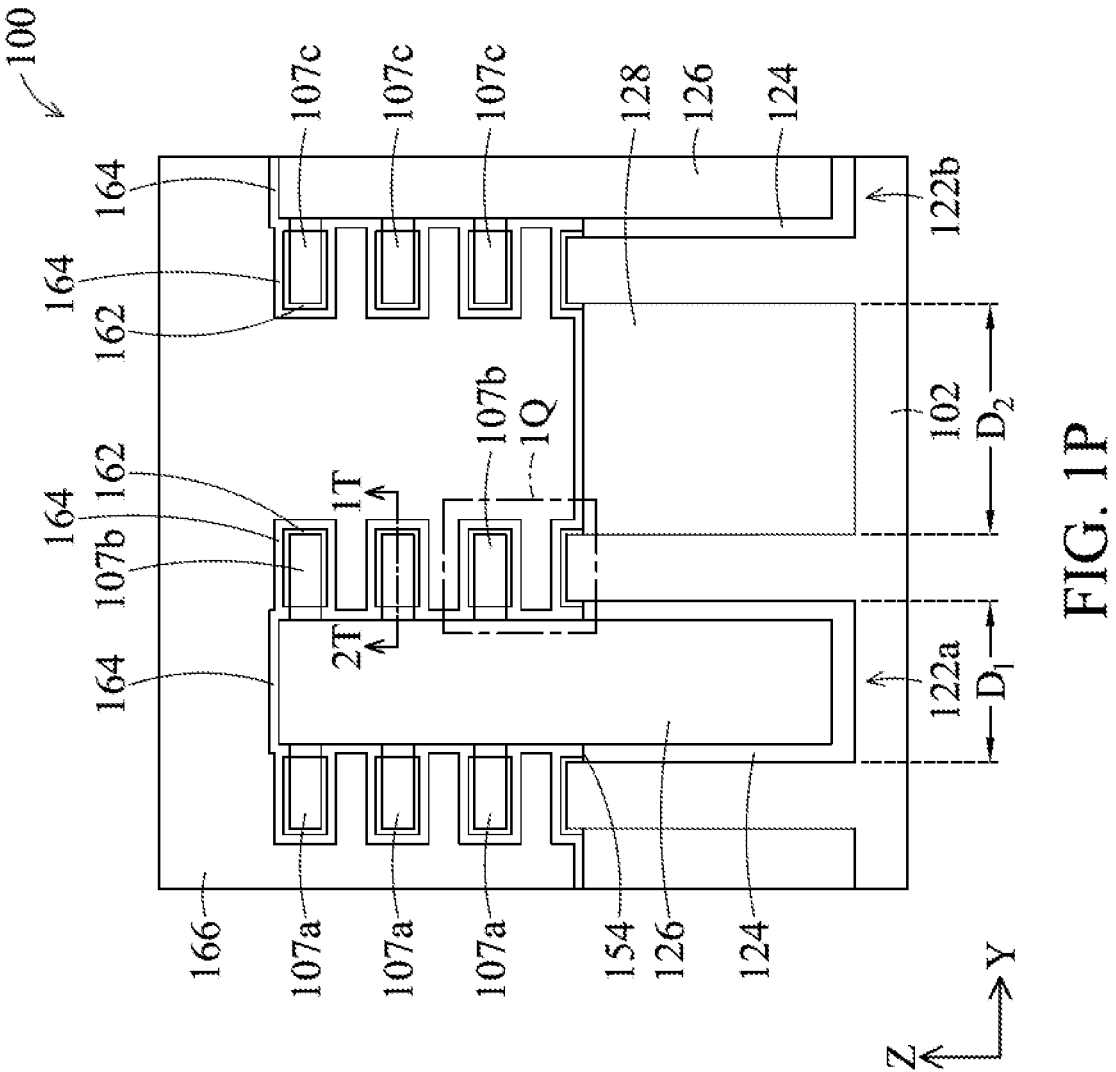
Figure 1Q:
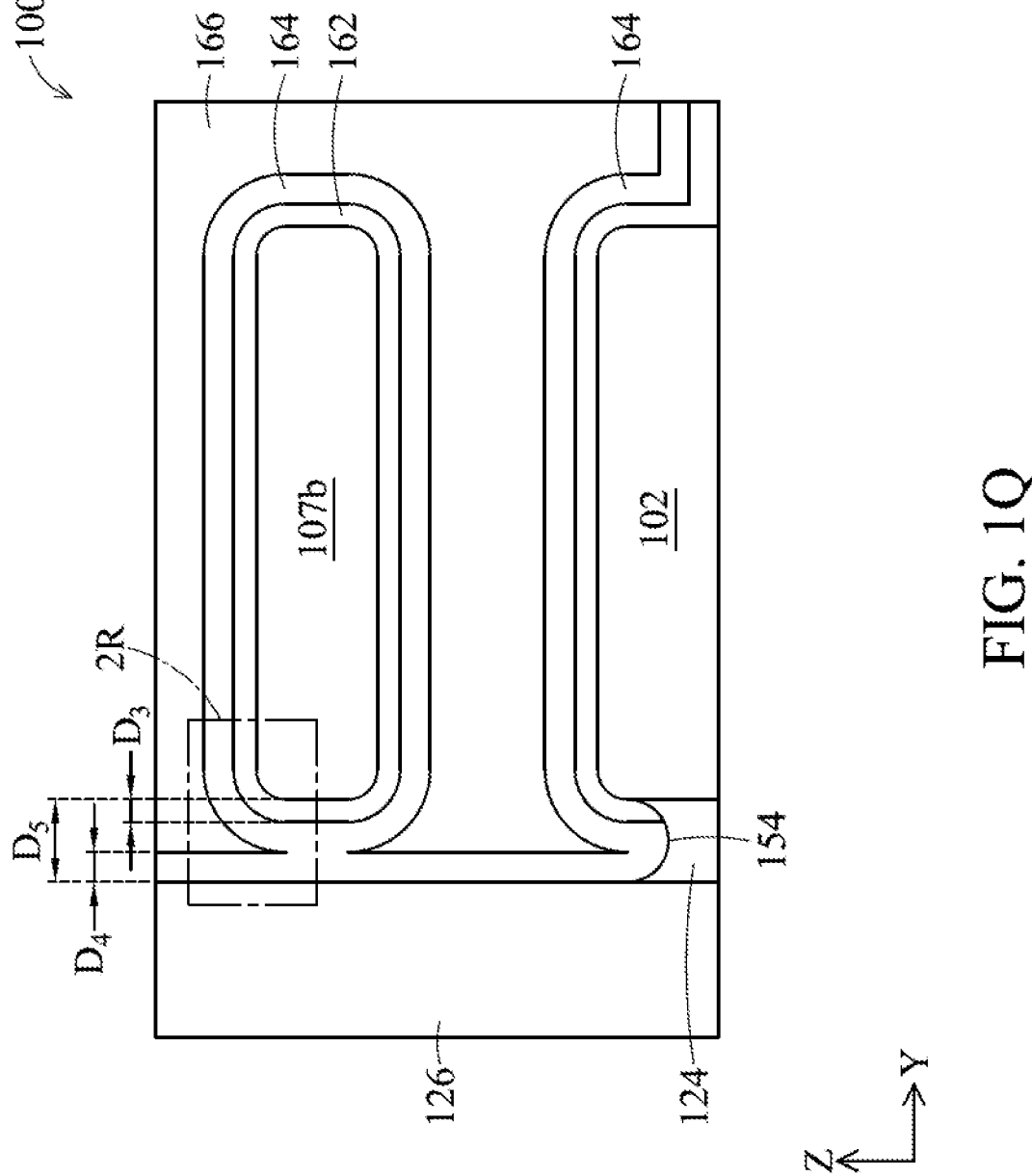
Figure 1S:
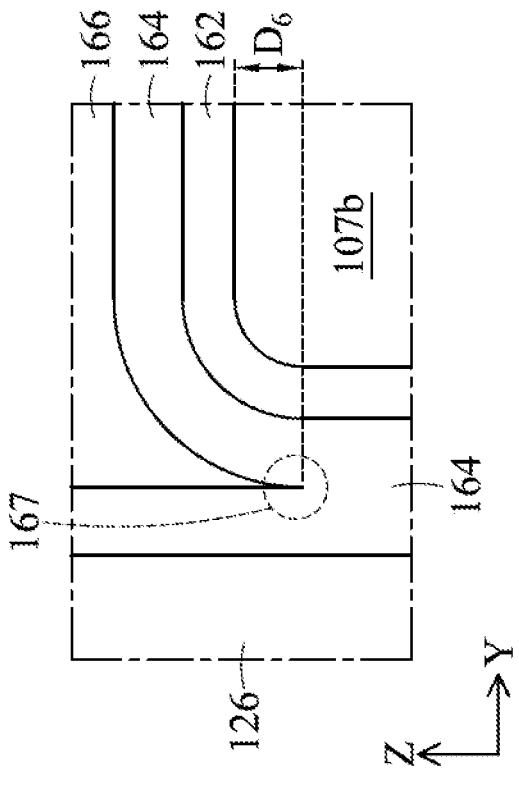
Figure 1R:
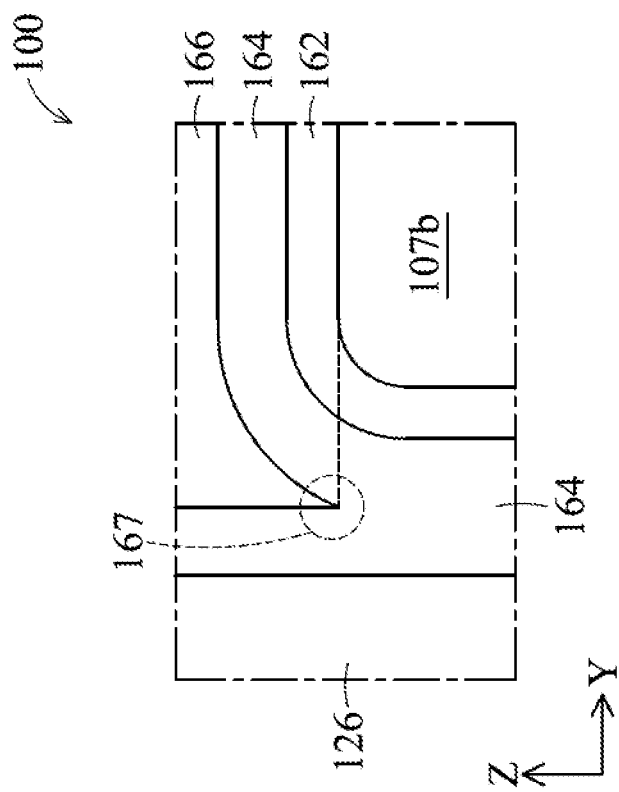
Figure 1T:
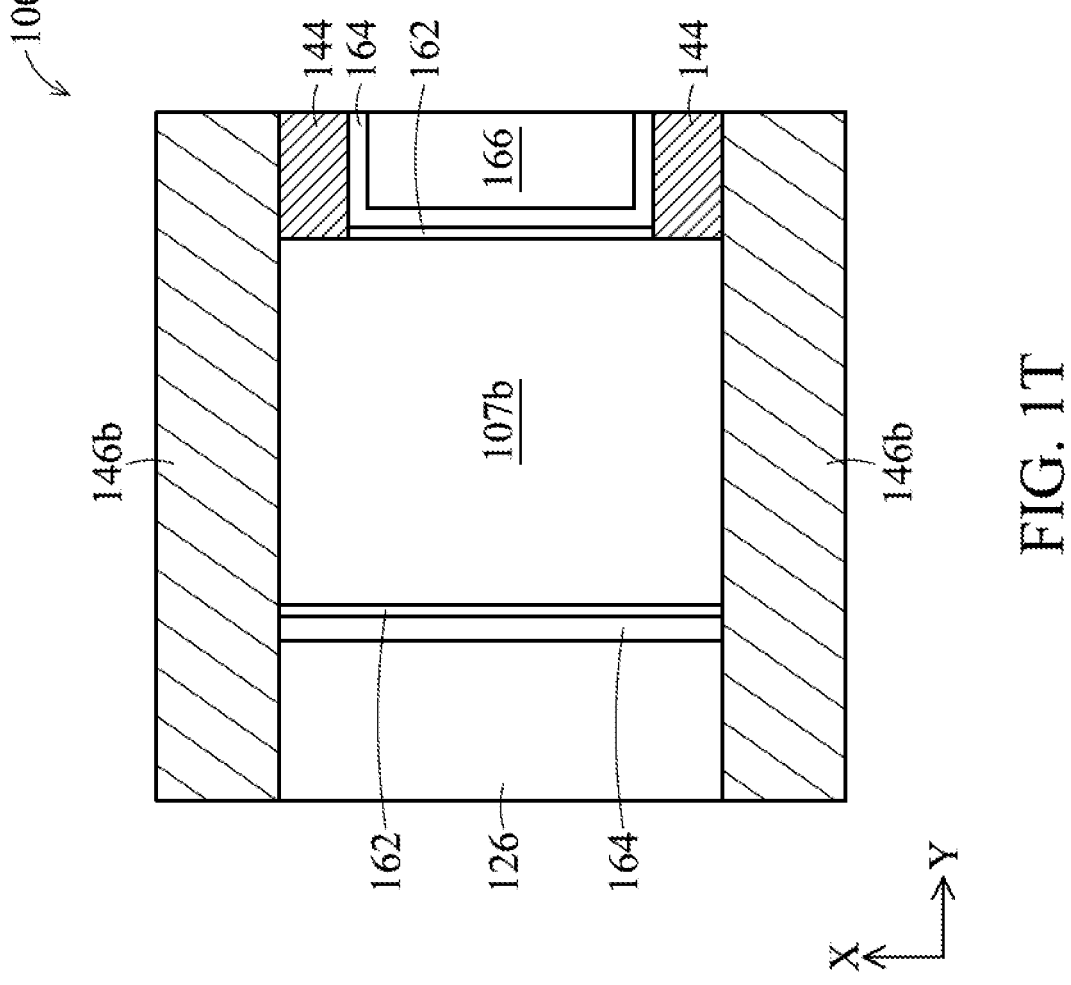

FIGS. 1A-1T are perspective and cross-sectional top and side views of a portion of an integrated circuit 100 fabricated according to some embodiments of the present disclosure. The fabrication process results in a plurality of semiconductor nanostructure transistors 103, as will be described in further detail below.

FIG. 1A is a perspective view of the integrated circuit 100 at an intermediate state of processing. The integrated circuit 100 includes a substrate 102. The substrate 102 may be a semiconductor substrate, such as a bulk semiconductor, or the like, which may be doped (e.g., with a p-type or an n-type dopant) or undoped. The semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

The integrated circuit 100 includes a semiconductor stack 104 including a plurality of semiconductor layers 106 and sacrificial semiconductor layers 108 alternating with each other. As will be set forth in further detail below, the semiconductor layers 106 will be patterned to form semiconductor nanostructures of a plurality of transistors. As set forth in more detail below, the sacrificial semiconductor layers 108 will eventually be entirely removed and are utilized to enable forming gate metals and other structures around the semiconductor nanostructures.

In some embodiments, the semiconductor layers 106 may be formed of a first semiconductor material suitable for n-type semiconductor nanostructure transistors, such as silicon, silicon carbide, or the like, and the sacrificial semiconductor layers 108 may be formed of a second semiconductor material suitable for p-type semiconductor nanostructure transistors, such as silicon germanium or the like. Each of the layers of the multi-layer stack 104 may be epitaxially grown using a process such as chemical vapor deposition (CVD), atomic layer deposition (ALD), vapor phase epitaxy (VPE), molecular beam epitaxy (MBE), or the like.

As shown in FIG. 1A, the integrated circuit 100 may include an optional sacrificial semiconductor layer 114, a dielectric layer 110, and a hard mask layer 112 formed over the top semiconductor layer 106. In some embodiments, the layer 110 is a pad oxide layer and the hard mask layer 112 may include silicon. In some embodiments, the sacrificial semiconductor layer 114 is not present. Other materials may be utilized for the dielectric layer 110 and the hard mask layer 112 without departing from the scope of the present disclosure.

Three layers of each of the semiconductor layers 106 and the sacrificial semiconductor layers 108 are illustrated. In some embodiments, the multi-layer stack 104 may include one or two each or four or more each of the semiconductor layers 106 and the sacrificial semiconductor layers 108. Although the multi-layer stack 104 is illustrated as including a sacrificial semiconductor layer 108 as the bottommost layer of the multi-layer stack 104, in some embodiments, the bottommost layer of the multi-layer stack 104 may be a semiconductor layer 106.

Due to high etch selectivity between the materials of the semiconductor layers 106 and the sacrificial semiconductor layers 108, the sacrificial semiconductor layers 108 of the second semiconductor material may be removed without significantly removing the semiconductor layers 106 of the first semiconductor material, thereby allowing the semiconductor layers 106 to be released to form channel regions of semiconductor nanostructure transistors.

In FIG. 1B, an etching process has been performed in conjunction with a photolithography mask. The etching process can include an anisotropic etching process that etches in the downward direction. The etching process defines fins 118a-d by forming trenches 120 through the hard mask layer 112, the dielectric layer 110, the sacrificial semiconductor layer 114, the sacrificial semiconductor layers 108, the semiconductor layers 106, and the substrate 102. Each fin 118a-d includes a plurality of semiconductor nanostructures 107 patterned from the semiconductor layers 106. Each fin 118 includes a plurality of sacrificial semiconductor nanostructures 109 patterned from the sacrificial semiconductor layers 108. As will be set forth in more detail below, the semiconductor nanostructures 107 will be utilized as channel regions of nanostructure transistors. The semiconductor nanostructures 107 may be termed the stacked channels. The fins 118a-d may be referred to without suffix as simply fins 118 when speaking of the fins generally. The semiconductor nanostructures 107a-d and the sacrificial semiconductor nanostructures 109a-d may likewise be referred to without suffix as simply the semiconductor nanostructures 107 and the sacrificial semiconductor nanostructures 109 when speaking of the semiconductor nanostructures and sacrificial semiconductor nanostructures in general.

The distance in the Y direction between adjacent fins 118a and 118b and between the adjacent fins 118c and 118d may be different than the distance between the adjacent fins 118b and 118c. In other words, the trenches 120 may have different widths in the Y direction. For example, the distance between the fins 118a and 118b and the distance between the fins 118c and 118d may be between 20 nm and 40 nm. The distance between the fins 118b and 118c may be between 40 nm and 60 nm. The semiconductor nanostructures 107 of each fin 118 may be referred to as stacks of semiconductor nanostructures. Other distances may be utilized without departing from the scope of the present disclosure. In some embodiments, the distances between all four adjacent fins may be the same.

The fins 118 and the semiconductor nanostructures 107 may be patterned by any suitable method. For example, one or more photolithography processes, including double-patterning or multi-patterning processes, may be used to form the fins 118 and the semiconductor nanostructures 107. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 118. In some embodiments, the hard mask layer 112 is patterned, for example by a photolithography process, then the pattern is transferred by an etching process to form the fins 118 and the semiconductor nanostructures 107. Each of the fins 118 and its overlying semiconductor nanostructures 107 may be collectively referred to as a "fin stack."

FIG. 1B illustrates the fins 118 having vertically straight sidewalls. In some embodiments, the sidewalls are substantially vertical (non-tapered), such that width of the fins 118 and the semiconductor nanostructures 107 is substantially similar, and the semiconductor nanostructures 107 are rectangular in shape (e.g., has rectangular profile in the Y-Z plane). In some embodiments, the fins 118 have tapered sidewalls, such that a width of each of the fins 118 and/or the semiconductor nanostructures 107 continuously increases in a direction towards the substrate 102. In such embodiments, the semiconductor nanostructures 107 may have a different width from each other and be trapezoidal in shape (e.g., have trapezoidal profile in the Y-Z plane).

In FIG. 1C, isolation structures 122a and 122b have been formed in some of the trenches 120. In particular, isolation structures 122 have been formed in the trench 120 between the fins 118a and 118b and in the trench 120 between the fins 118c and 118d. An isolation structure is not present between the fins 118b and 118c.

In some embodiments, each isolation structure 122 includes a shell dielectric layer 124. The shell dielectric layer 124 is deposited conformally on the sidewalls and bottoms of the corresponding trenches 120. The shell dielectric layer 124 is in contact with sidewalls of substrate 102 at the bottom of the trenches 120. The shell dielectric layer 124 is in contact with sidewalls of the substrate 102, with sidewalls of the semiconductor nanostructures 107, with sidewalls of the sacrificial semiconductor nanostructures 109, with sidewalls of the dielectric layer 110, and with sidewalls of the hard mask layer 112 in the trenches 120.

The shell dielectric layer can be deposited by CVD, ALD, PVD, or other suitable deposition processes. The shell dielectric layer 124 may be formed of a low-k dielectric material. The low K dielectric material of the shell dielectric layer 124 can include SiN, SiCN, SiOC, SiOCN, or other suitable dielectric materials. The shell dielectric layer 124 can have a thickness between 2 nm and 6 nm. Other materials, deposition processes, and thicknesses can be utilized for the shell dielectric layer 124 without departing from the scope of the present disclosure. The shell dielectric layer 124 may be referred to as a dielectric liner layer.

The isolation structures 122 may include a core dielectric layer 126. The core dielectric layer 126 may be deposited on the shell dielectric layer 124 in the appropriate trenches 120. The core dielectric layer 126 may fill the remaining portion of the trenches 120 not filled by the shell dielectric layer 124. The core dielectric layer may have a thickness in the Y direction between 8 nm and 36 nm. The core dielectric layer may be deposited by CVD, ALD, PVD, or other suitable deposition processes. The core dielectric layer 126 may be or include SiN, SiCN, SiOC, SiOCN. Other dimensions, materials, and deposition processes can be utilized for the core dielectric layer 126 without departing from the scope of the present disclosure.

In some embodiments, the material of the shell dielectric layer 124 is different than the material of the core dielectric layer 126. In some embodiments, the shell dielectric layer 124 is either SiOC or SiOCN and the core dielectric layer 126 is either SiN or SiCN. In some embodiments, the shell dielectric layer 124 is either SiN or SiCN and the core dielectric layer 126 is either SiOC or SiOCN. In some embodiments, the core dielectric layer 126 has a lower dielectric constant than the shell dielectric layer 124. This can help reduce capacitances associated with the transistors as the core dielectric layer 126 is relatively thick compared to the shell dielectric layer 124.

After deposition of the shell dielectric layer 124 and the core dielectric layer 126, an etchback process may be performed to recess the isolation structures 122 with respect to the top surfaces of the hard mask layer 112. In some embodiments, the shell dielectric layer 124 and the core dielectric layer 126 may be deposited in all of the trenches 120. The shell dielectric layer 124 and the core dielectric layer 126 may then be selectively removed from some of the trenches 120 via photolithography processes or other processes in order to ensure that isolation structures 122 are not present in certain of the trenches 120 as shown in FIG. 1C.

In FIGS. 1D, trench isolation regions 128, which may be shallow trench isolation (STI) regions, are formed in the trenches 120 in which isolation structures 122 have not been formed. Accordingly, a shallow trench isolation region 128 is formed between the fins 118b and 118c and to the left of the fin 118a. The trench isolation regions 128 may be formed by depositing a dielectric material. In some embodiments, the dielectric material is formed over the substrate 102, the fins 118, and semiconductor nanostructures 107, and between adjacent fins 118 and semiconductor nanostructures 107. The dielectric material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 102, the fins 118, and the semiconductor nanostructures 107. Thereafter, the dielectric material may be formed over the liner of a material such as those discussed above.

In FIG. 1D, a chemical mechanical polish (CMP), an etch-back process, combinations thereof, or the like, have been performed to remove excess insulation material of the dielectric material over hard mask layer 112, as shown in FIG. 1D. A portion of the material of the shallow trench isolation regions 128 remains on top of the isolation structures 122.

In FIG. 1E, several etching processes have been performed. A first etching process, may remove the hard mask layer 112, the dielectric layer 110, and the sacrificial semiconductor layer 114 from on top of the fins 118. This etching process can include one or more etching steps including wet etches, dry etches, or other types of etching processes. A second etching process may then be performed to recess the shallow trench isolation regions 128. The second etching process can include a wet etch, dry etch, a timed etch, or other types of etching processes that can recess the height of the shallow trench isolation regions 128. The result is that the tops of the fins 118 are exposed. In particular, the top semiconductor nanostructure 107 of each fin 118 is exposed. The tops of the isolation structures 122 are also exposed. Sidewalls of the semiconductor nanostructures 107 and sacrificial semiconductor nanostructures 109 are exposed where the shallow trench isolation regions 128 have been recessed. A CMP process may then be performed to ensure that the top surfaces of the fins 118 are substantially coplanar with the top surfaces of the isolation structures 122.

Though not shown in FIG. 1E, appropriate wells (not separately illustrated) may also be formed in the fins 118, the semiconductor nanostructures 107, and/or the trench isolation regions 128. Using masks, an n-type impurity implant may be performed in p-type regions of the substrate 102, and a p-type impurity implant may be performed in n-type regions of the substrate 102. Example n-type impurities may include phosphorus, arsenic, antimony, or the like. Example p-type impurities may include boron, boron fluoride, indium, or the like. An annealing may be performed after the implants to repair implant damage and to activate the p-type and/or n-type impurities. In some embodiments, in situ doping during epitaxial growth of the fins 118 and the semiconductor nanostructures 107 may obviate separate implantations, although in situ and implantation doping may be used together.

In FIG. 1F, sacrificial gate structures 130 have been formed over the fins 118, the isolation structures 122, the trench isolation regions 128 and the semiconductor nanostructures 107. Two sacrificial gate structures 130 are shown in FIG. 1F. In practice, many further sacrificial gate structures 130 may be formed substantially parallel to and concurrently with the sacrificial gate structures 130 shown in FIG. 1F.

In FIG. 1F, a sacrificial gate dielectric layer 132 has been formed prior to forming the sacrificial gate structures 130. The sacrificial gate dielectric layer 132 can include a SiO or other suitable dielectric materials. In some embodiments, the gate dielectric layer 130 has a low K dielectric material. The sacrificial gate dielectric 132 can be deposited by CVD, ALD, or PVD.

The sacrificial gate structures include a sacrificial gate layer 134 on the sacrificial gate dielectric layer 132. The sacrificial gate layer can include materials that have a high etch selectivity with respect to the trench isolation regions 128. The sacrificial gate layer 134 may be a conductive, semiconductive, or non-conductive material and may be or include amorphous silicon, polycrystalline-silicon (polysilicon), poly-crystalline silicon-germanium (poly-SiGe), metallic nitrides, metallic silicides, metallic oxides, and metals. The sacrificial gate layer 134 may be deposited by physical vapor deposition (PVD), CVD, sputter deposition, or other techniques for depositing the selected material.

The sacrificial gate structures 130 include a dielectric layer 136 on the sacrificial gate layer 134 and a dielectric layer 138 on the dielectric layer 136. The dielectric layers 136 and 138 may correspond to first and second mask layers. The dielectric layer 136 can include silicon nitride, silicon oxynitride, or other suitable dielectric materials. The dielectric layer 138 can include silicon nitride, silicon oxynitride or other suitable dielectric materials. The dielectric layers 136 and 138 are different materials from each other and can be deposited using CVD, ALD, PVD, or other suitable deposition processes. Other materials and deposition processes can be utilized for the dielectric layers 136 and 138 without departing from the scope of the present disclosure.

After deposition of the layers 132, 134, 136, and 138, the dielectric layers 136 and 138 may be patterned to act as a mask layers. An etching process may then be performed in the presence of the patterned dielectric layers in order to etch exposed regions of the sacrificial gate layer 134 and the sacrificial gate dielectric layer 132. This results in the structure shown in FIG. 1F.

In FIG. 1G, following formation of the sacrificial gate structures 130, one or more gate spacer layers 140 have been formed covering the sacrificial gate structures 130, the fins 118, the trench isolation regions 128, and the isolation structures 122. The gate spacer layer 140 can be formed by PVD, CVD, ALD, or other suitable deposition processes. Following formation of the gate spacer layer 140, horizontal portions (e.g., in the X-Y plane) of the gate spacer layer 140 may be removed, thereby exposing upper surfaces of the fins 118, the isolation structures 122 and the trench isolation regions 128. The gate spacer layers 140 can include one or more of SiO, SiN, SiON, SiCN, SiOCN, SiOC, or other suitable dielectric materials.

In FIG. 1H, one or more etching operations have been performed to recess the fins 118, the isolation structures 122, and the trench isolation regions 128 exposed through the gate spacer layer 140. The removal operations may include suitable etch operations for removing materials of the semiconductor nanostructures 107, the sacrificial semiconductor nanostructures 109, the fins 118, the isolation structures 122, and the trench isolation regions 128. The etching processes can include reactive ion etching (RIE), neutral beam etching (NBE), atomic layer etching (ALE), or the like. The etching processes may form trenches 142 through the fins 118 in the areas exposed by the gate spacer layers 140. In practice, a large number of trenches 142 may be formed through fins 118 between large numbers of sacrificial gate structures 130. The result is that a large number of stacked of semiconductor nanostructures 107 are formed from each fin 118. In FIG. 1H, stacks of semiconductor nanostructures 107d and 107e have been defined from each other from the fin 118d. The semiconductor nanostructures 107d will be utilized as stacked channels of a transistor. The semiconductor nanostructures 107e will be utilized as stacked channels of a separate transistor. The trenches 142 correspond to source/drain trenches. In particular, the source/drain regions will be formed at those locations where the fins 118 have been recessed, as will be set forth in more detail below.

In some embodiments, at the stage of processing of FIG. 1H, dielectric support elements 141 remain on the trench isolation regions 128. The dielectric support elements 141 are remnants of the gate spacer layers 140. As will be set forth in more detail below, the dielectric support elements 141 may be utilized to direct or confine the growth of source/drain regions.

In some embodiments, the shell dielectric layer 124 and the dielectric support elements 141 are of different materials. The shell dielectric layer 124 and the dielectric support elements 141 may extend to different vertical heights at the stage of processing shown in FIG. 1H. Alternatively, in some embodiments the shell dielectric layer 124 and the dielectric support elements 141 may extend to a same height.

In FIG. 1I, inner spacers 144 have been formed. A selective etching process is performed to recess exposed end portions of the sacrificial semiconductor nanostructures 109 without substantially etching the semiconductor nanostructures 107. Next, the inner spacers are formed by depositing a dielectric material to fill the recesses between the semiconductor nanostructures 107 formed by the previous selective etching process. The inner spacer 144 may be a suitable dielectric material, such as silicon carbon nitride (SiCN), silicon oxycarbonitride (SiOCN), or the like, formed by a suitable deposition method such as physical vapor deposition (PVD), CVD, ALD, or the like. An etching process, such as an anisotropic etching process, is performed to remove portions of the inner spacer 144 disposed outside the recesses in the sacrificial semiconductor nanostructures 109. The remaining portions of the dielectric layer corresponds to the inner spacers 144 shown in FIG. 1I.

In FIG. 1J source/drain regions 146a have been formed. In the illustrated embodiment, the source/drain regions 146 are epitaxially grown from epitaxial material(s). The source/drain regions 146 are grown on exposed portions of the fins 118 and contact the semiconductor nanostructures 107. Initially, the source/drain regions 146 grow between neighboring isolation structures 128 or between an isolation structure 128 and an isolation structure 122. The dielectric isolation structures 122 may be formed at the cell boundary. However, the dielectric isolation structures 122 may also be formed within the cell.

For each stack of semiconductor nanostructures 107, there are two source/drain regions 146. For the stack of semiconductor nanostructures 107a, the source/drain regions 146a are in direct contact with the semiconductor nanostructures 107a. Only a single source/drain region 146a is apparent in FIG. 1J. This is because the source/drain region 146a is on the opposite side of the semiconductor nanostructures 107a in the X direction and is obscured in the view of FIG. 1J. Accordingly, the semiconductor nanostructures 107a extend in the X direction between two source/drain regions 146a. Likewise, the semiconductor nanostructures 107b extend in the X direction between two source/drain regions 146b. The semiconductor nanostructures 107c extend in the X direction between two source/drain regions 146c. The semiconductor nanostructures 107d extend in the X direction between two source/drain regions 146d. FIG. 1J also illustrates that the semiconductor nanostructures 107d and 107e share a source/drain region 146d/e. Each of these stacks of semiconductor nanostructures 107 may share a source/drain region 146 with a stack of semiconductor nanostructures 107 that is adjacent in the X direction.

The dielectric support elements 141 that remain on the trench isolation regions 128 laterally confine the growth of source/drain regions 146 as they grow upward from the fins 118. In some embodiments, the source/drain regions 146 exert stress in the respective semiconductor nanostructures 107, thereby improving performance. The source/drain regions 146 are formed such that each sacrificial gate structure 130 is disposed between respective neighboring pairs of the source/drain regions 146. In some embodiments, the spacer layer 140 and the inner spacers 144 separate the source/drain regions 146 from the sacrificial gate layer 134 by an appropriate lateral distance (e.g., in the X-axis direction) to prevent electrical bridging to subsequently formed gates of the resulting device.

As set forth previously, in some embodiments shell dielectric layer 124 and the dielectric support elements 141 may extend to different vertical heights. This can result in asymmetries in the source/drain regions 146. For example, if the shell dielectric layer 124 extends to a greater height than the dielectric support elements 141, then the source/drain regions 146 will be able to begin growing laterally in the Y direction above the dielectric support elements earlier than above the shell dielectric layer 124 during the epitaxial growth process. Accordingly, in some embodiments the shape of the source/drain regions 146 may be asymmetric.

The source/drain regions 146 may include any acceptable material, such as appropriate for n-type or p-type devices. For n-type devices, the source/drain regions 146 include materials exerting a tensile strain in the channel regions, such as silicon, SiC, SiCP, SiP, or the like, in some embodiments. When p-type devices are formed, the source/drain regions 146 include materials exerting a compressive strain in the channel regions, such as SiGe, SiGeB, Ge, GeSn, or the like, in accordance with certain embodiments. The source/drain regions 146 may have surfaces raised from respective surfaces of the fins and may have facets. Neighboring source/drain regions 146 may merge in some embodiments to form a singular source/drain region 146 over two neighboring fins of the fins 118.

The source/drain regions 146 may be implanted with dopants followed by an annealing process. The source/drain regions 146 may have an impurity concentration of between about $10^{19}$ cm$^{-3}$ and about $10^{21}$ cm$^{-3}$. N-type and/or p-type impurities for source/drain regions 146 may be any of the impurities previously discussed. In some embodiments, the source/drain regions 146 are in situ doped during growth.

In FIG. 1K, a contact etch stop layer (CESL) 148 and an interlayer dielectric (ILD) 150 have been formed. The CESL 148 can include a thin dielectric layer which can be conformally deposited on exposed surfaces of the source/drain regions 146, the isolation structures 122, the dielectric support elements 141, and the trench isolation regions 128. The CESL layer 148 can include SiN, SiC, SiOC, SiOCN, SiON, or other suitable dielectric materials. The CESL 148 can be deposited by CVD, ALD, PVD, or other suitable deposition processes.

The dielectric layer 150 covers the CESL 148. The dielectric layer 150 can include SiO, SiON, SiN, SiC, SiOC, SiOCN, SiON, or other suitable dielectric materials. The dielectric layer 150 can be deposited by CVD, ALD, PVD, or other suitable deposition processes.

In FIG. 1L, the sacrificial gate structures 130 have been removed from between the gate spacer layers 140. The view of FIG. 1L is taken further inward in the X direction compared to the view of FIG. 1K such that the source/drain regions 146a-d are not apparent. In particular, the view of FIG. 1L is taken along cut lines 1L from FIG. 1K. Only the source/drain region 146d/e coupled to the far side of the semiconductor nanostructures 107d and the source/drain region 146e coupled to the far side of the semiconductor nanostructures 107e are apparent in FIG. 1L. Removal of the sacrificial gate structures 130 includes removal of the layers 132, 134, 136, and 138 via one or more etching processes.

Removal of the sacrificial gate structures can include first performing a planarization process, such as a CMP to level the top surfaces of the sacrificial gate layer 134 and gate spacer layer 140. The planarization process may also remove the dielectric layers 136 and 138 on the sacrificial gate layer 134, and portions of the gate spacer layer 140 along sidewalls of the dielectric layers 136 and 138. Accordingly, the top surfaces of the sacrificial gate layer 134 are exposed.

Next, the sacrificial gate layer 134 can be removed in an etching process, so that recesses are formed. In some embodiments, the sacrificial gate layer 134 is removed by an anisotropic dry etch process. For example, the etching process may include a dry etch process using reaction gases that selectively etch the sacrificial gate layer 134 without etching the spacer layer 140. The sacrificial gate dielectric layer 132, when present, may be used as an etch stop layer when the sacrificial gate layer 134 is etched. The sacrificial gate dielectric layer 132 may then be removed after the removal of the sacrificial gate layer 134.

In FIG. 1M, semiconductor nanostructures 107 are released by removal of the sacrificial semiconductor nanostructures 109. The sacrificial semiconductor nanostructures 109 are removed to release the semiconductor nanostructures 107. The sacrificial semiconductor nanostructures 109 can be removed by a selective etching process using an etchant that is selective to the material of the sacrificial semiconductor nanostructures 109, such that the sacrificial semiconductor nanostructures 109 are removed without substantially etching the semiconductor nanostructures 107. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like. In some embodiments, the sacrificial semiconductor nanostructures 109 are removed and the semiconductor nanostructures 107 are patterned to form channel regions of both PFETs and NFETs.

In some embodiments, the semiconductor nanostructures 107 are reshaped (e.g. thinned) by a further etching process to improve gate fill window. The reshaping may be performed by an isotropic etching process selective to the semiconductor nanostructures 107. After reshaping, the semiconductor nanostructures 107 may exhibit the dog bone shape in which middle portions of the semiconductor nanostructures 107 are thinner than peripheral portions of the semiconductor nanostructures 107 along the X-axis direction.

In FIG. 1N, following release of the semiconductor nanostructures 107, the shell dielectric layer 124 of the isolation structure 122 is trimmed. In particular, an etching process is performed to decrease the height of the shell dielectric layer 124 of the isolation structures 122. The etching process selectively etches the material of the shell dielectric layer 124 with respect to the material of the core dielectric layer 126 and the semiconductor nanostructures 107. The etching process can include an anisotropic etching process that selectively etches in the downward direction. The etching can be timed to select a final height of the top surface 154 of the shell dielectric layer 124. Alternatively, the etching process can include a timed isotropic etching process. The etching process can include a wet etch, a dry etch, or other suitable etching processes. The duration of the etching process can be selected to ensure that the shell dielectric layer 124 is entirely removed above the top surface 158 of the substrate 102. In some embodiments, portions of the shell dielectric layer may remain above the top surface 158 of the substrate 102.

After the etching process, the shell dielectric layer has a top surface 154 that is lower than the top surface 156 of the core dielectric layer 126. The top surface 154 of the shell dielectric layer 124 is lower than a lowest semiconductor nanostructure 107 of each stack. In some embodiments, the top surface 154 of the shell dielectric layer 124 is lower than a top surface 158 of the substrate 102, as shown in FIG. 1N the top surface 154 of the shell dielectric layer 124 may be substantially even with a top surface 160 of the trench isolation regions 128.

Another result of the etching process of the shell dielectric layer 124 is that the shell dielectric layer 124 may be entirely removed between the semiconductor nanostructures 107 and the core dielectric layer 126. Accordingly, at the stage of processing shown in FIG. 1N, there is a gap between the end of the semiconductor nanostructures 107 and the adjacent core dielectric layer 126. The gap between the ends of the semiconductor nanostructures 107 and the adjacent core dielectric layer 126 is a dimension in the Y direction between 2 nm and 6 nm, substantially the thickness of the shell dielectric layer 124 prior to etching. If the shell dielectric layer 124 is not entirely removed, the there may be a gap between the semiconductor nanostructures 107 and the shell dielectric layer 124.

In FIG. 1O, an interfacial gate dielectric layer 162 has been deposited. The interfacial gate dielectric layer 162 is deposited on all exposed surfaces of the semiconductor nanostructures 107. The interfacial gate dielectric layer 162 surrounds the semiconductor nanostructures 107. The interfacial gate dielectric layer 162 can include a dielectric material such as silicon oxide, silicon nitride, or other suitable dielectric materials. The interfacial gate dielectric layer 162 can include a comparatively low-K dielectric with respect to high-K dielectric such as hafnium oxide or other high-K dielectric materials that may be used in gate dielectrics of transistors. High-K dielectrics can include dielectric materials with a dielectric constant higher than the dielectric constant of silicon oxide. The interfacial gate dielectric layer 162 can be formed by a thermal oxidation process, a chemical vapor deposition (CVD) process, or an atomic layer deposition (ALD) process. The interfacial gate dielectric layer 162 can have a thickness between 0.5 nm and 2 nm. Other materials, deposition processes, and thicknesses can be utilized for the interfacial gate dielectric layer 162 without departing from the scope of the present disclosure.

In FIG. 1O, a high-K dielectric layer 164 has been deposited. The high-K dielectric layer 164 is deposited in a conformal deposition process. The conformal deposition process deposits the high-K dielectric layer 164 on the interfacial gate dielectric layer 162, on the top surface of the shell dielectric layer 124 and on sidewalls of the core dielectric layer 126. The high-K dielectric layer 164 is also deposited on sidewalls of the gate spacer layers 140. The high-K gate dielectric layer 164 surrounds the semiconductor nanostructures 107. The high-K gate dielectric layer 164 has a thickness between 1 nm and 3 nm. The high-K gate dielectric layer 164 fills the remaining gap between the interfacial gate dielectric layer 162 and the sidewalls of the core dielectric layer 126. The high-K dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The high-K dielectric layer 164 may be formed by CVD, ALD, or any suitable method. Other thicknesses, deposition processes, and materials can be utilized for the high-K dielectric layer 164 without departing from the scope of the present disclosure.

In FIG. 1O, a gate metal 166 has been deposited. The gate metal 166 is deposited on all exposed surfaces of the high-K dielectric layer 164. The gate metal 166 substantially surrounds semiconductor nanostructures 107. Although the gate metal 166 is shown as a single layer in FIG. 1O, in practice, the gate metal 166 can include one or more conductive liner layers, work function layers, and gate fill layers that collectively make up the gate metal. The gate metal can include one or more of Ti, TiN, Ta, TaN, Al, Cu, Co, Ru, W, Au, or other suitable conductive materials. The gate metal 166 can be deposited by PVD, ALD, or CVD. Other configurations, materials, and deposition processes can be utilized for the gate metal 166 without departing from the scope of the present disclosure.

In some embodiments, if the high-K dielectric layer 164 is not sufficiently thick to fill the gap between the interfacial dielectric layer 162 and the core dielectric layer 126, then it is possible that some amount of gate metal 166 will be deposited between semiconductor nanostructures 107 and the core dielectric layer 126 in areas not occupied by the high-K dielectric layer 164. If a remaining gap is too small, gate metal 166 may not be deposited.

At the stage of processing shown in FIG. 1O, transistors 103a-e are substantially complete. The transistor 103a includes semiconductor nanostructures 107a extending between the source/drain regions 146a and acting as stacked channels of the transistor 103a. The gate metal 166 acts as a gate electrode surrounding the semiconductor nanostructures 107a. The transistor 103b includes semiconductor nanostructures 107b extending between the source/drain regions 146b and acting as stacked channels of the transistor 103b. The gate metal 166 acts as a gate electrode surrounding the semiconductor nanostructures 107b. The transistor 103c includes semiconductor nanostructures 107c extending between the source/drain regions 146c and acting as stacked channels of the transistor 103c. The gate metal 166 acts as a gate electrode surrounding the semiconductor nanostructures 107c. The transistor 103d includes semiconductor nanostructures 107d extending between the source/drain regions 146d and 146d/e and acting as stacked channels of the transistor 103d. The gate metal 166 acts as a gate electrode surrounding the semiconductor nanostructures 107d. The transistor 103e includes semiconductor nanostructures 107e extending between the source/drain regions 146d/e and 146e and acting as stacked channels of the transistor 103e. The gate metal 166 acts as a gate electrode surrounding the semiconductor nanostructures 107e.

In FIG. 1O, there are no breaks in the gate metal 166, such that the gate electrodes of the transistors 103a-d are all shorted together. Though not shown in FIG. 1O, in further processing steps etching processes may be performed to electrically isolate portions of the gate metal 166 to form electrically isolated gate electrodes for the transistors 103a-d.

FIG. 1P is a side view of the integrated circuit 100 at the stage of processing of FIG. 1O, in accordance with some embodiments. In FIG. 1P, the width of the trench between the fins 118a and 118b is a dimension D1. The dimension D1 can be between 20 nm and 40 nm. The width of the trench between fins 118b and 118c is a dimension D2. The dimension D2 is between 40 nm and 60 nm. Other values can be used for the dimensions D1 and D2 without departing from the scope of the present disclosure.

FIG. 1P more clearly illustrates how the high-K dielectric layer 164 is conformally deposited on both the semiconductor nanosheets 107 and on the sidewalls of the core dielectric layer 126. The portions of the high-K dielectric layer 164 to grow on the semiconductor nanostructures 107 merged together with the portions of the high-K dielectric layer 164 that grows on the sidewalls of the core dielectric layer 126.

FIG. 1Q is an enlarged view a portion of the integrated circuit 100 of FIG. 1P, in accordance with some embodiments. The view of FIG. 1Q is taken from box 1Q in FIG. 1P. FIG. 1Q illustrates the interfacial gate dielectric layer 162 has a thickness dimension D3. The dimension D3 is between 0.5 nm and 2 nm. The high-K gate dielectric layer 164 has a width dimension D4. The dimension D4 is between 1 nm and 3 nm. The semiconductor nanosheets 107 are separated from the core dielectric layer 126 by a width dimension D5. The dimension D5 has a value between 2 nm and 6 nm. Other values for the dimensions D3, D4, and D5 can be utilized without departing from the scope of the present disclosure.

FIG. 1R is a further enlarged view of the integrated circuit 100 corresponding to the box 2R of FIG. 1Q, in accordance with some embodiments. FIG. 1R illustrates that the gate metal 166 extends to a depth substantially equal to a top surface of the semiconductor nanostructure 107b. Near each semiconductor nanostructure 107, the gate metal 166 has a corner region 167 at which the gate metal 166 comes to a point where the high-K dielectric layer 164 that grows from the interfacial gate dielectric layer 162 meets the portion of the high-K dielectric layer 164 that grows from the core dielectric layer 126. In some embodiments, the lowest point of the gate metal in the corner region 167 substantially level with a top surface of the corresponding semiconductor nanostructure 107.

FIG. 1S is an enlarged view of an integrated circuit 100 similar to FIG. 1R, but with a slightly different structure, in accordance with some embodiments. In FIG. 1S, the corner region 167 of the gate metal 166 extends to a depth dimension D6 below a top surface of the adjacent semiconductor nanostructure 107. The dimension D6 can have a value between 0 nm and 1 nm. Other values for the dimension D6 can be utilized without departing from the scope of the present disclosure. The depth to which the corner region 167 of the gate metal 166 extends can be adjusted by adjusting the thickness of the interfacial gate dielectric layer 162 and the high-K gate dielectric layer 164. However, if the corner region 167 extends to a depth greater than 1 nm below the top surface of the semiconductor nanostructure 107, it may be difficult to retain uniform gate metal extension and uniform device performance.

FIG. 1T is an enlarged plane view cut of the integrated circuit 100 of FIG. 1P taken along cut lines 1T, in accordance with some embodiments. FIG. 1T illustrates the semiconductor nanostructure 107b extending in the X direction between the source/drain regions 146b. FIG. 1T illustrates the interfacial gate dielectric layer 162 between the semiconductor nanostructure 107b and the gate metal 166 and between the semiconductor nanostructure 107b and the core dielectric layer 126. In some embodiments, the thickness of the interfacial gate dielectric layer is the same adjacent to the core dielectric layer 126 and on the opposite side of the semiconductor nanostructure 107b addition to the gate metal 166. FIG. 1T also illustrates the inner spacers 144 that electrically isolate the gate metal 166 from the source/drain regions 146b.

Figure 2A:
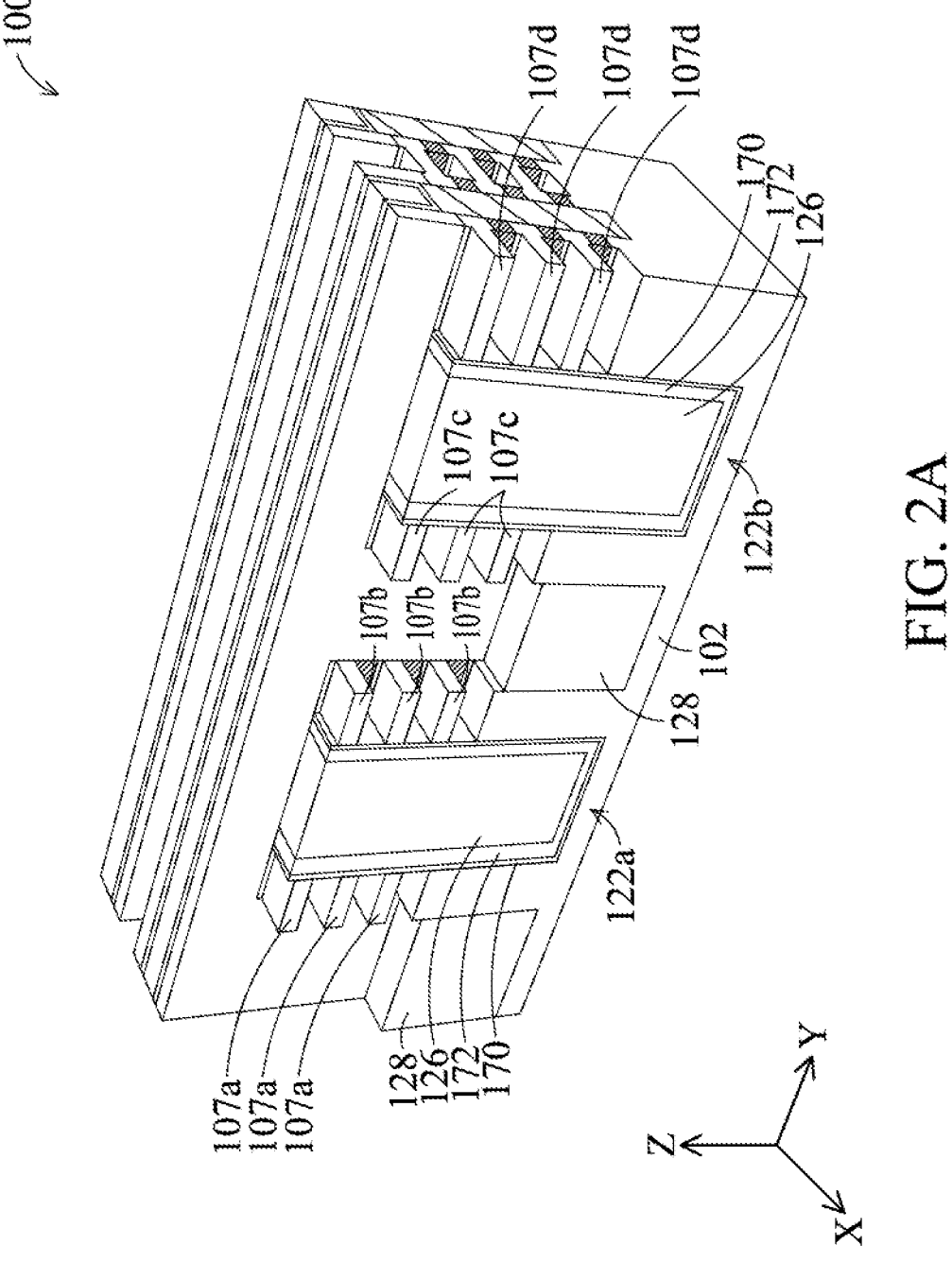
FIGS. 2A-2H are perspective, side-sectional, and plane views of an integrated circuit at intermediate stages of processing, in accordance with some embodiments.

FIGS. 2A-2H are perspective views, cross-sectional views, and plane views of an integrated circuit 100 at various stages of processing, in accordance with some embodiments. FIG. 2A is a perspective view of an integrated circuit 100 at the stage of processing corresponding substantially to the stage of processing shown in FIG. 1M, in accordance with some embodiments. The integrated circuit 100 of FIG. 2A differs from the integrated circuit 100 of FIG. 1M in that the isolation structures 122 of FIG. 2A having different configuration of layers than do the isolation structures 122 of FIG. 1M. In particular, the isolation structures 122 of FIG. 2A have a first shell dielectric layer 170, a second shell dielectric layer 172, and a core dielectric layer 126. Accordingly, the isolation structures 122 of FIG. 2A have a bilayer shell dielectric layer.

The isolation structures 122 of FIG. 2A can be formed at the stage of processing of FIG. 1C. The first shell dielectric layer 170 is deposited conformally on the sidewalls and bottoms of the corresponding trenches 120. The first shell dielectric layer 170 is in contact with sidewalls of substrate 102 at the bottom of the trenches 120. The first shell dielectric layer 170 is in contact with sidewalls of the substrate 102, with sidewalls of the semiconductor nanostructures 107, with sidewalls of the sacrificial semiconductor nanostructures 109, with sidewalls of the dielectric layer 110, and with sidewalls of the hard mask layer 112 in the trenches 120.

The first shell dielectric layer 170 can be deposited by CVD, ALD, PVD, or other suitable deposition processes. The first shell dielectric layer 170 may be formed of a low-k dielectric material. The low K dielectric material of the first shell dielectric layer 170 can include SiN, SiCN, SiOC, SiOCN, or other suitable dielectric materials. The first shell dielectric layer 170 can have a thickness between 0.5 nm and 2 nm. Other materials, deposition processes, and thicknesses can be utilized for the first shell dielectric layer 170 without departing from the scope of the present disclosure. The first shell dielectric layer 170 may be referred to as a first dielectric liner layer.

The second shell dielectric layer 172 is deposited conformally on the first shell dielectric layer 170. The second shell dielectric layer 172 can be deposited by CVD, ALD, PVD, or other suitable deposition processes. The second shell dielectric layer 172 may be formed of a low-k dielectric material. The low K dielectric material of the second shell dielectric layer 172 can include SiN, SiCN, SiOC, SiOCN, or other suitable dielectric materials. The second shell dielectric layer 172 can have a thickness between 1.5 nm and 5 nm. Other materials, deposition processes, and thicknesses can be utilized for the second shell dielectric layer 172 without departing from the scope of the present disclosure. The second shell dielectric layer 172 may be referred to as a second dielectric liner layer.

The core dielectric layer 126 may be deposited on the second shell dielectric layer 172 in the appropriate trenches 120. The core dielectric layer 126 may fill the remaining portion of the trenches 120 not filled by the shell dielectric layers 170 and 172. The core dielectric layer 126 may be deposited by CVD, ALD, PVD, or other suitable deposition processes. The core dielectric layer 126 may be or include SiN, SiCN, SiOC, SiOCN. Other dimensions, materials, and deposition processes can be utilized for the core dielectric layer 126 without departing from the scope of the present disclosure.

In some embodiments, the material of the first shell dielectric layer 170 is different than the material of the second shell dielectric layer 172. In some embodiments, the first shell dielectric layer 170 is either SiOC or SiOCN and the second shell dielectric layer 172 is either SiN or SiCN. In some embodiments, the first shell dielectric layer 170 is either SiN or SiCN and the second shell dielectric layer 172 is either SiOC or SiOCN. In some embodiments, the core dielectric layer 126 and the first shell dielectric layer 170 can have a same material.

Figure 2B:
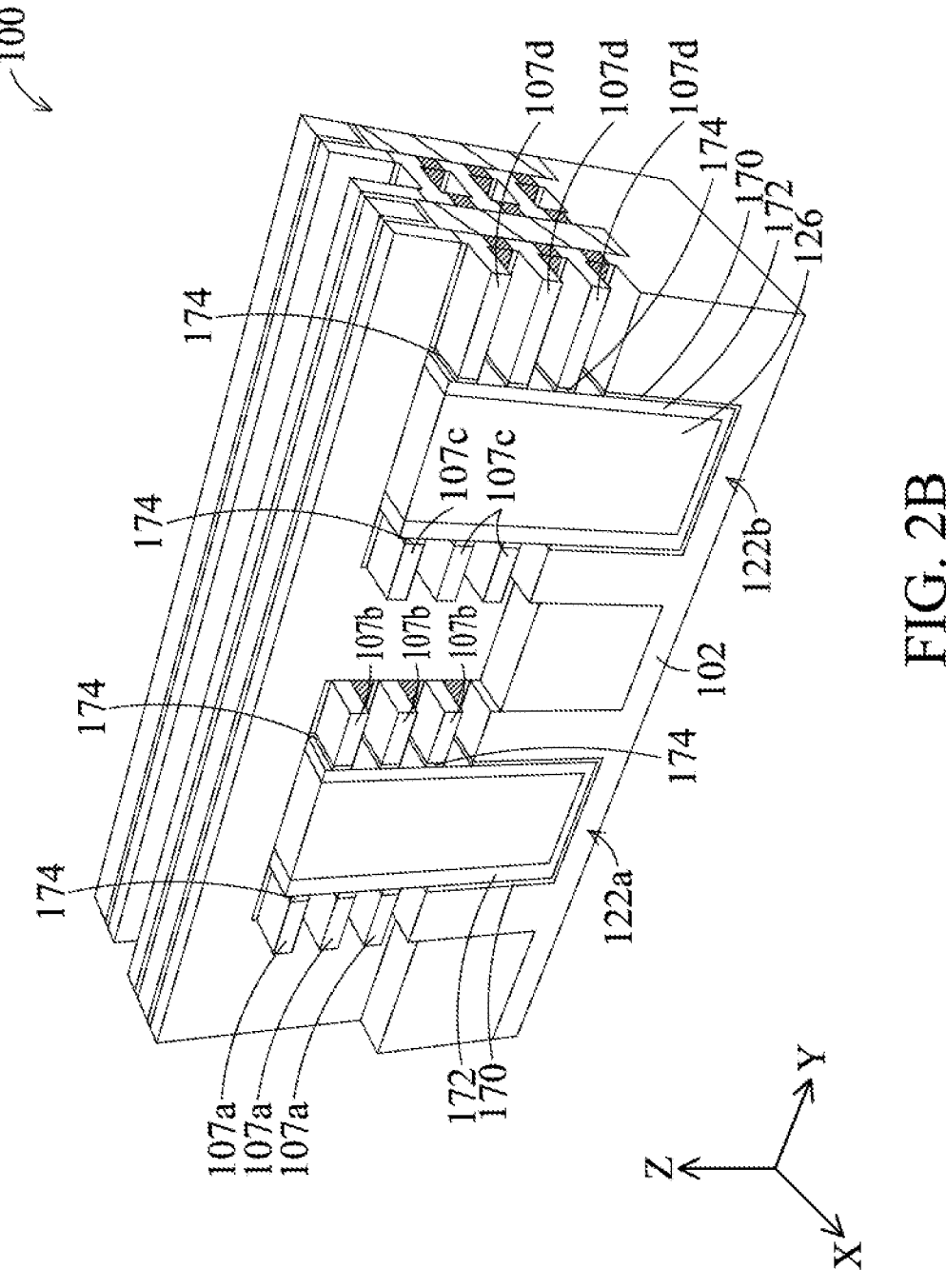

In FIG. 2B, an etching processes has been performed. The etching process selectively etches the first shell dielectric layer 170 with respect to the second shell dielectric layer 172. The etching process may selectively etch in lateral directions such that dielectric remnants 174 from the first shell dielectric layer 170 remain between the semiconductor nanostructures 107 and the second shell dielectric layer 172.

Figure 2C:
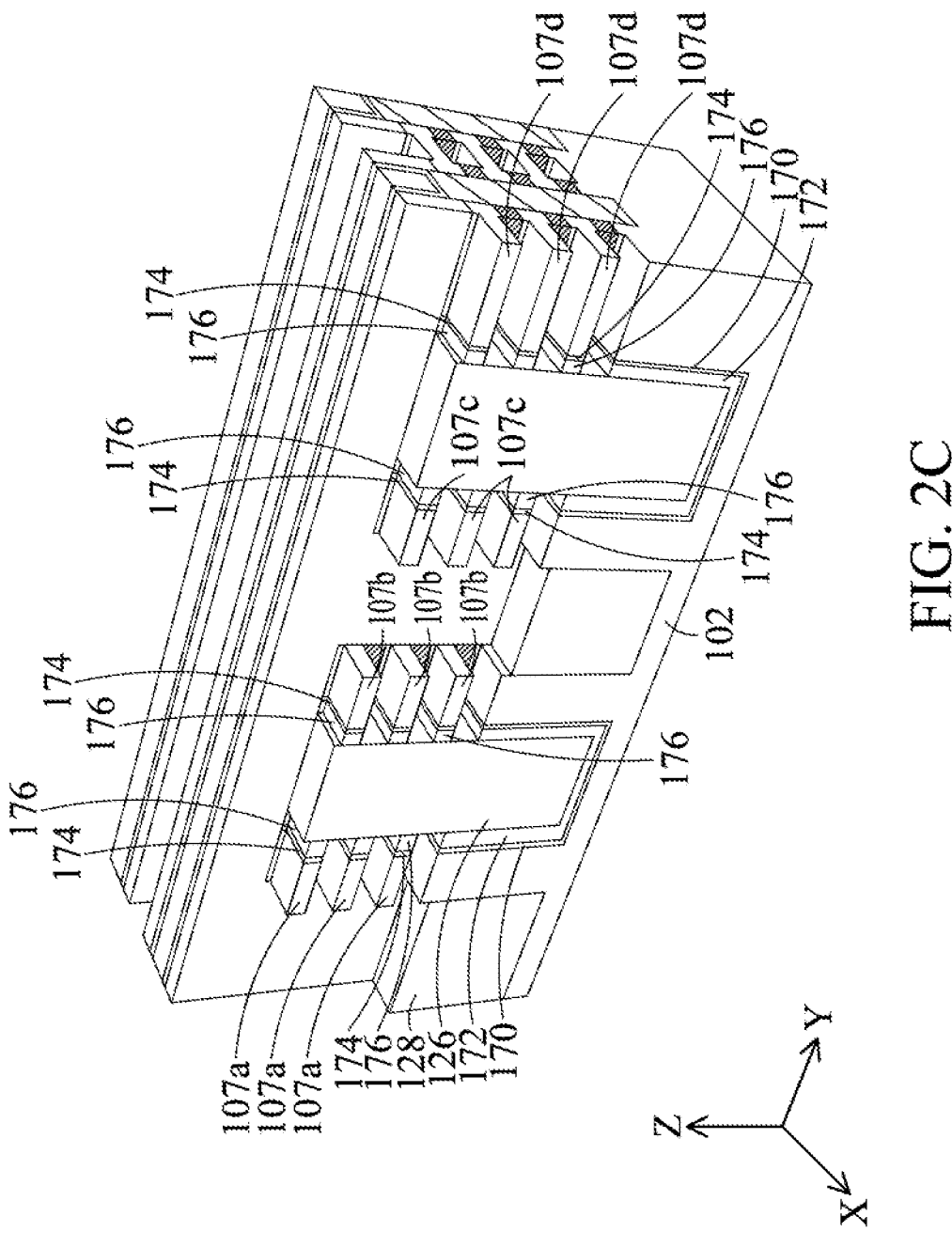

In FIG. 2C, an etching processes has been performed. The etching process selectively etches the second shell dielectric layer 172 with respect to the core dielectric layer 126. The etching process may selectively etch in lateral directions such that dielectric remnants 176 from the second shell dielectric layer 172 remain between the dielectric remnants 174 and the core dielectric layer 126.

Figure 2D:
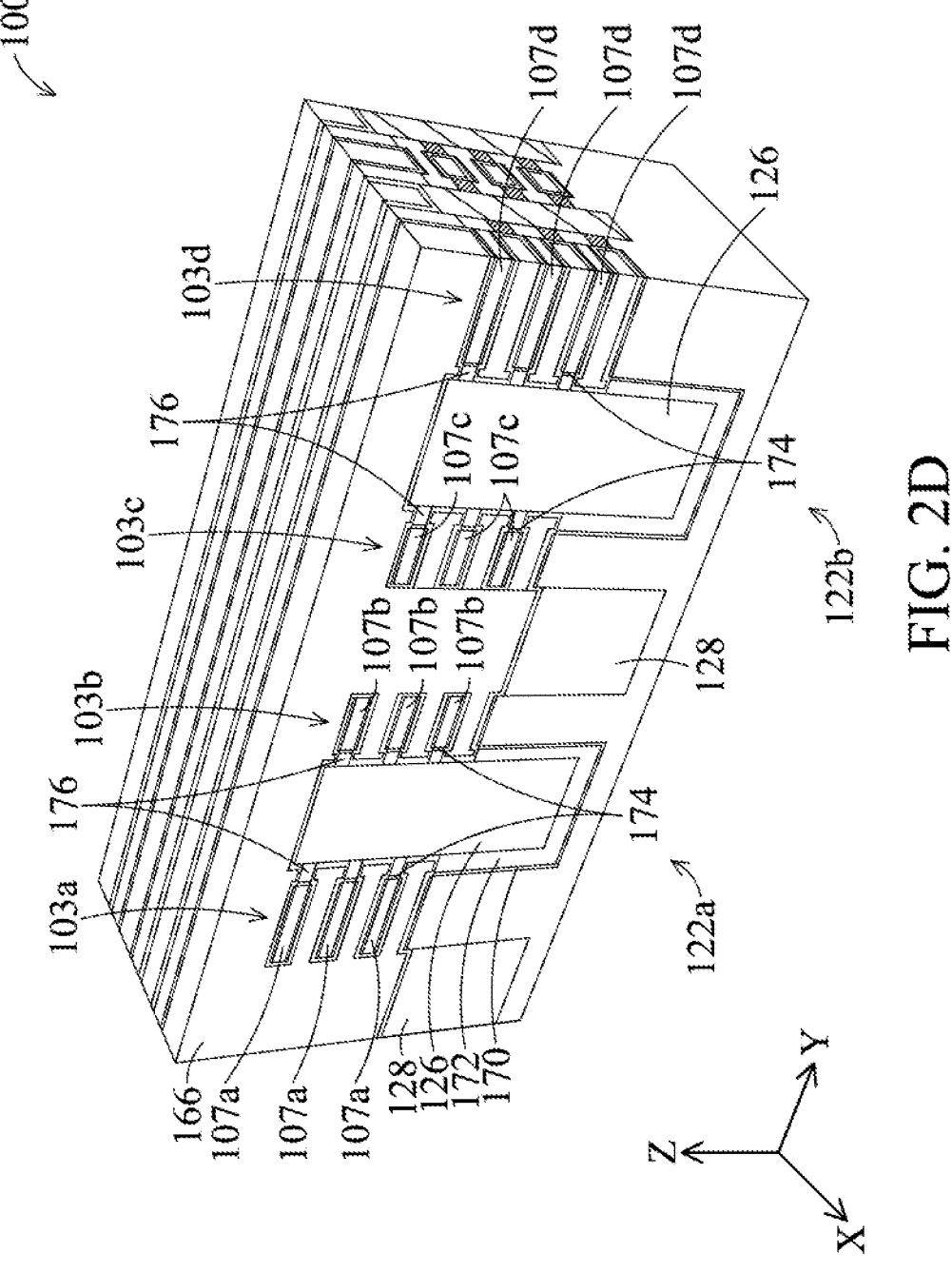

FIG. 2D is a view of the integrated circuit 100 at the stage of processing substantially similar to the stage of processing shown in FIG. 1O, except that the dielectric remnants 174 and 176 of the first and second shell dielectric layers 170 and 172 are present between the semiconductor nanostructures 107 and the core dielectric layer 126. The interfacial gate dielectric layer 162, the high-K gate dielectric layer 164, and the gate metal 166 have been deposited. Formation of the transistors 103a-d is substantially complete.

Figure 2E:
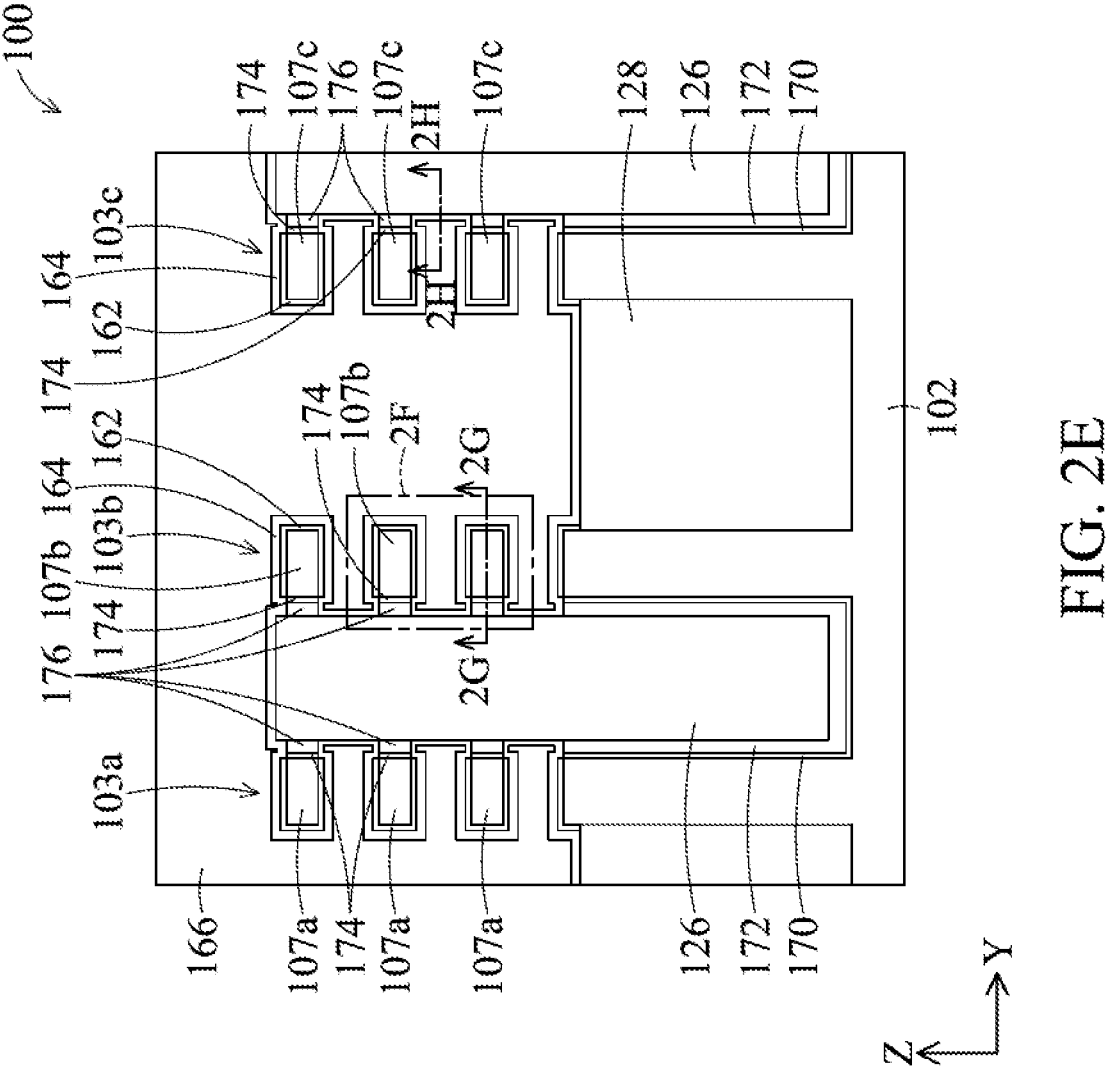

FIG. 2E is a side view of the integrated circuit 100 at the stage of processing substantially similar to the stage of processing shown in FIG. 1P, except that the dielectric remnants 174 and 176 of the first and second shell dielectric layers 170 and 172 are present between the semiconductor nanostructures 107 and the core dielectric layer 126.

Figure 2F:
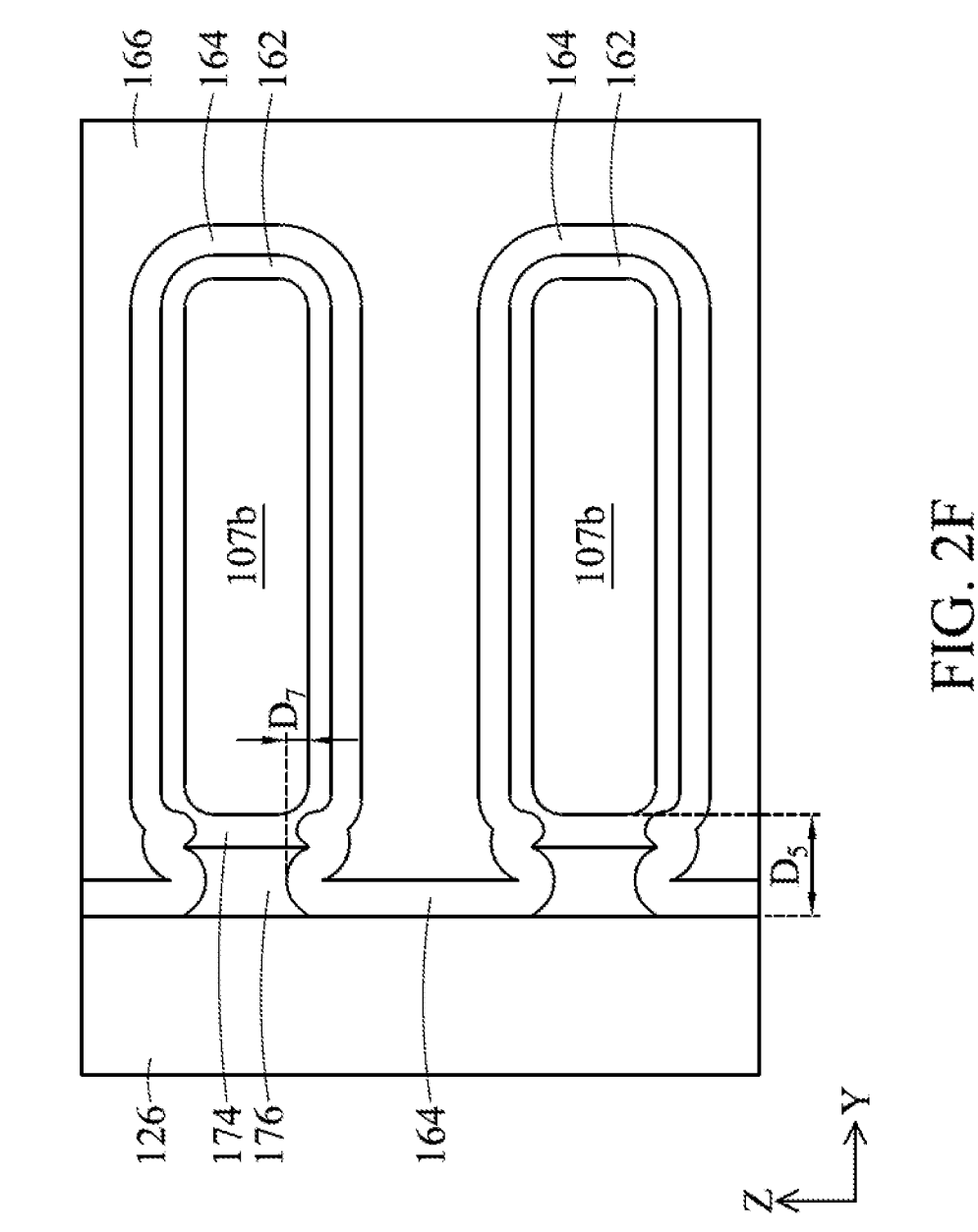

FIG. 2F is an enlarged view of a portion of the integrated circuit 100 of FIG. 2E corresponding to box 2F from FIG. 2E. FIG. 2F illustrates that the high-K dielectric layer 164 impinges into the dielectric remnant 176 a vertical dimension D7 higher than a bottom surface of the adjacent semiconductor nanostructure 107b, and, similarly, lower than a top surface of the adjacent semiconductor nanostructure 107b. The vertical dimension D7 can be between 0 nm and 2 nm, though other dimensions can be utilized without departing from the scope of the present disclosure.

Figure 2G:
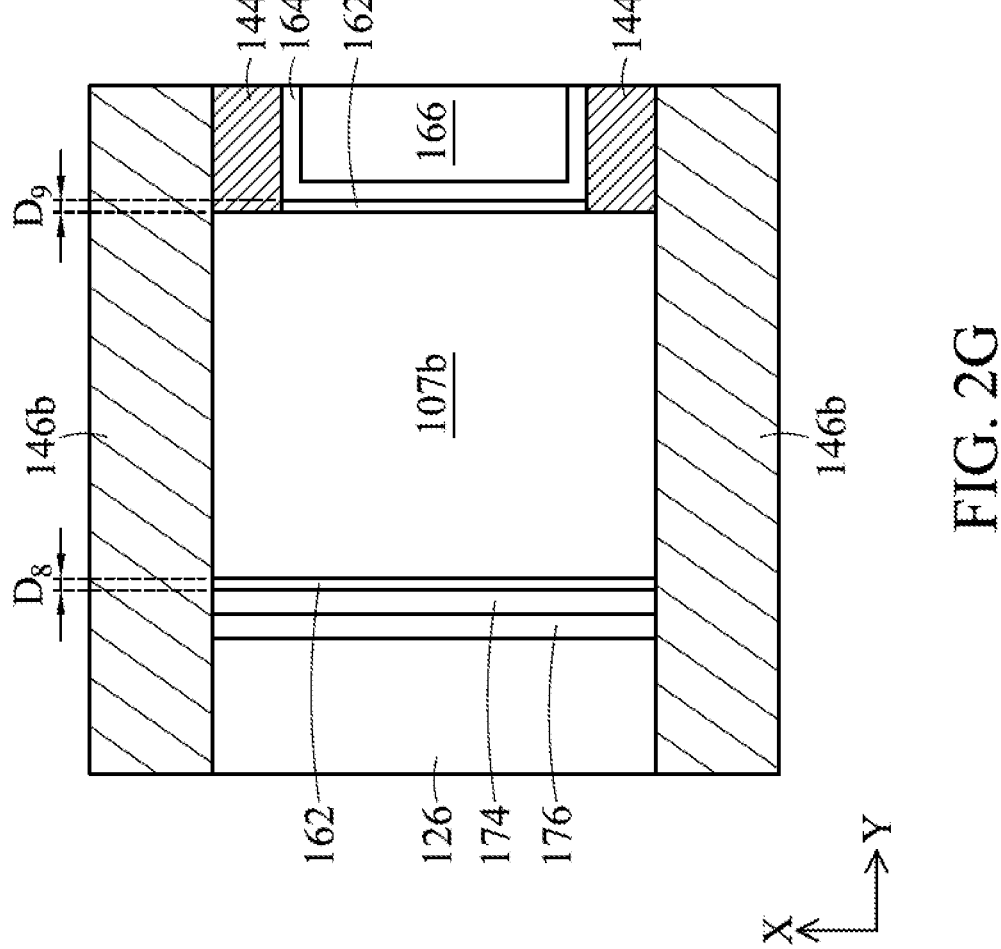

FIG. 2G is an enlarged plane view taken along cut lines 2G in FIG. 2E, in accordance with some embodiments. The view of FIG. 2G is substantially similar to the view of FIG. 1T, except that the dielectric remnants 174 and 176 are present between the semiconductor nanostructure 107 and the core dielectric layer 126, rather than the high-K dielectric layer 164 that fills the space in FIG. 1T. Additionally, an interfacial gate dielectric layer 162 has grown between the semiconductor nanostructure 107b and the dielectric layer 174 the portion of the interfacial gate dielectric layer 162 that grows adjacent to the dielectric remnant 174 results from diffusion, While the portion of the interfacial gate dielectric layer 162 between the high-K dielectric layer 164 and the semiconductor nanostructure 107b is formed due to direct oxidation. Due to the different ways in which the portions of the interfacial gate dielectric layer 162 are grown, the interfacial gate dielectric layer 162 adjacent to the dielectric remnant 174 has a thickness dimension D8 that is smaller than a thickness dimension D9 of the interfacial gate dielectric layer 162 adjacent to the high-K dielectric layer 164.

Figure 2H:
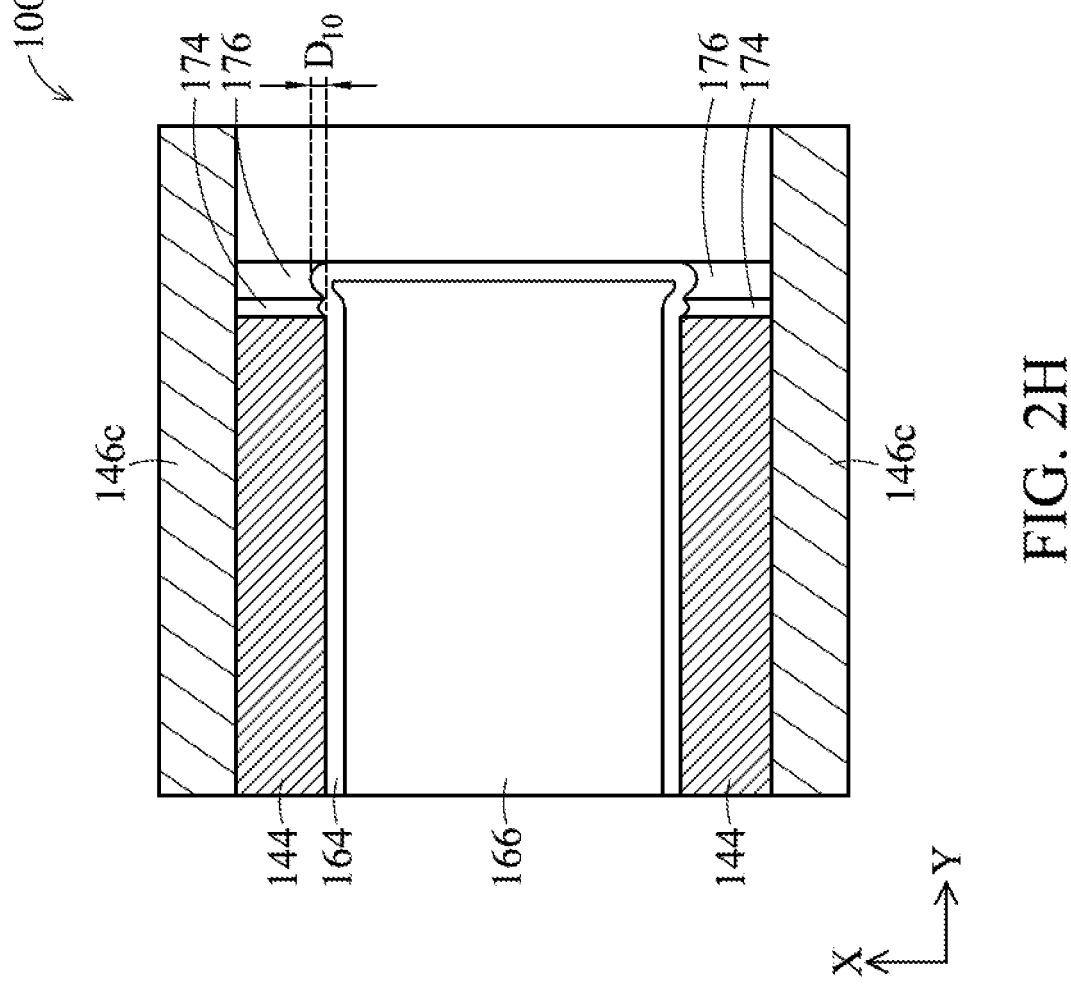

FIG. 2H is an enlarged plane view taken along cut lines 2H in FIG. 2E, in accordance with some embodiments. The cut line 2H does not pass through the semiconductor nanostructure 107. Instead, FIG. 2G illustrates how portion of the gate metal 166 and the interfacial gate dielectric layer 164 fill a space left by the removal of portions of the first and second shell dielectric layers 170 and 172. Furthermore FIG. 2H illustrates that the high-K dielectric layer 164 deviates a dimension D10 in the X direction adjacent to the dielectric remnants 174 and 176. The dimension D10 illustrates the lateral loss in thickness of the dielectric remnant 174 and 176. The dimension D10 can be between 0 nm and 2 nm.

Figure 3:
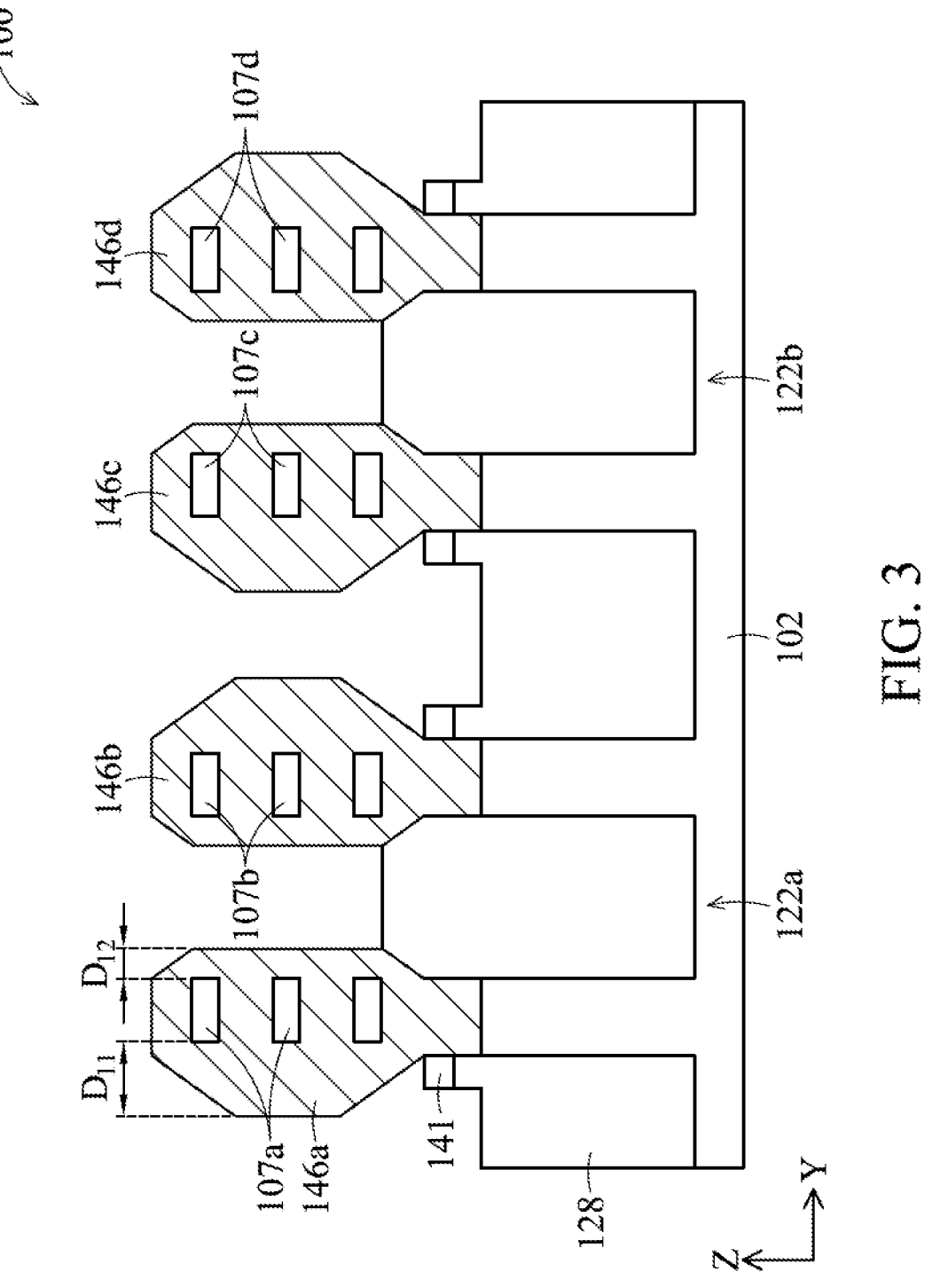
FIG. 3 is a side-sectional view of an integrated circuit, in accordance with some embodiments.

FIG. 3 is a cross-sectional view of an integrated circuit 100, in accordance with some embodiments. In FIG. 3, the integrated circuit 100 is at a stage of processing corresponding to the stage of processing shown in FIG. 1J. However, the dielectric isolation structures 122 in FIG. 3, the dielectric isolation structures 122 have a top surface that is higher than a top surface of the dielectric support elements 141 on the trench isolation regions 128. This mismatch in height causes asymmetric formation of the source/drain regions 146. In particular, the source/drain regions 146 have a lateral extent dimension D11 from an edge of the semiconductor nanostructure 107 on the side closest to the dielectric support element 141. The source/drain regions 146 have a lateral extent dimension D12 from the edge of the semiconductor nanostructures 107 on the side closest to the isolation structures 122. In some embodiments, D11 is between 10 nm and 20 nm. D12 is between 5 nm and 10 nm. D12 is smaller than D11. This is different than the source/drain regions 146 of FIG. 1J, in which D11 and D12 are substantially identical and the source/drain regions are substantially symmetrical. Other dimensions and configurations can be utilized without departing from the scope of the present disclosure.

Figure 4A:
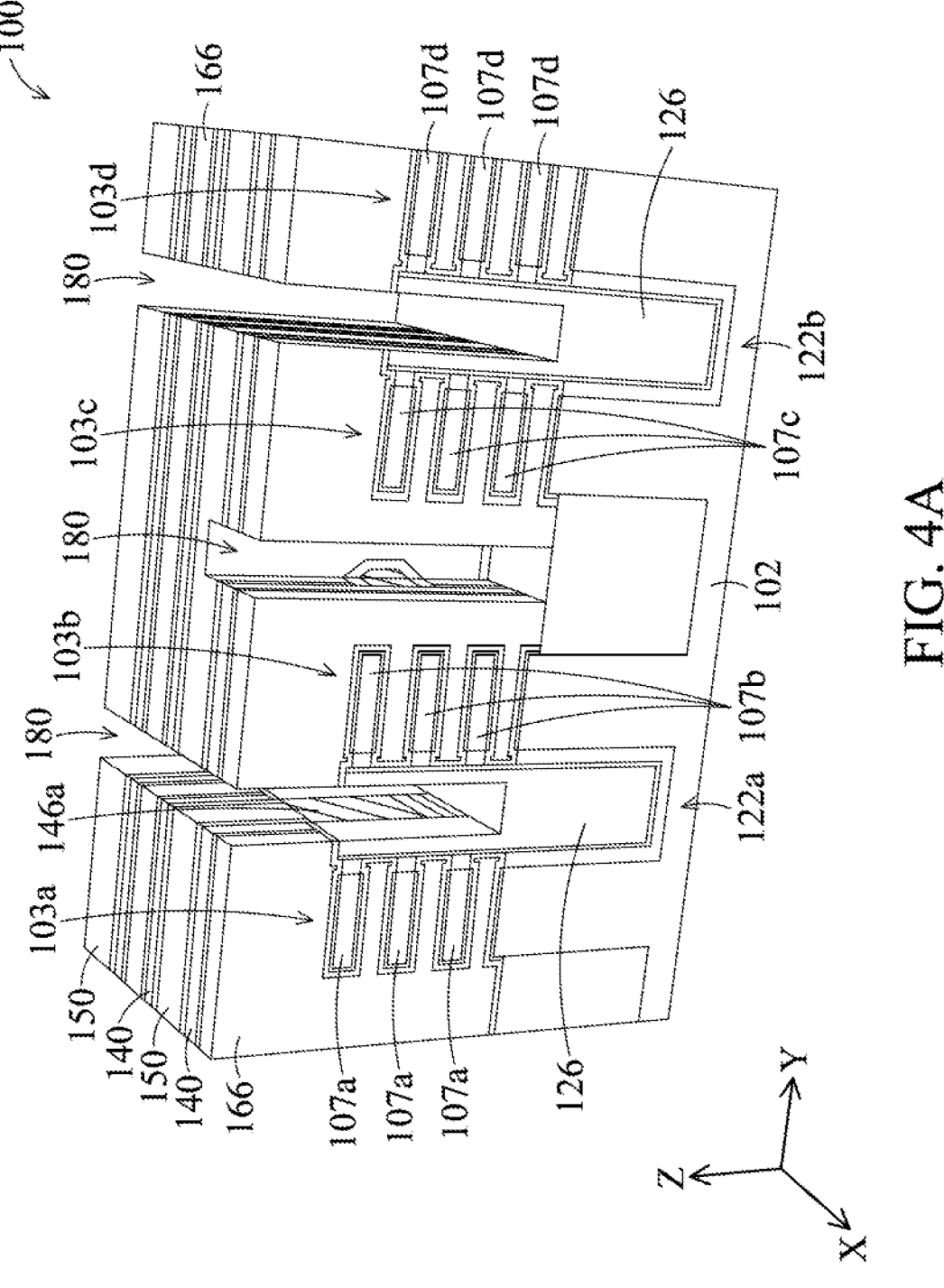
FIGS. 4A-4D are perspective and side-sectional views of an integrated circuit at intermediate stages of processing, in accordance with some embodiments.

FIG. 4A is a perspective view of an integrated circuit 100, in accordance with some embodiments. The view of FIG. 4A can correspond to a process step shortly after the view of FIG. 1O. In particular, an etching processes has been performed. The etching process can be performed in accordance with a pattern photolithography mask to form trenches 180 in the integrated circuit 100. The trenches 180 cut through the gate metal 166, gate spacers 140, the dielectric layer 150, source/drain regions 146, and other structures. Forming the trenches electrically isolates the gate metals 166 of adjacent transistors 103. This process may be termed a cut metal gate process. The etching process may include multiple etching steps or single etching step. The trenches 180 extend partially into the core dielectric layer 126 of the isolation structures 122. Accordingly, the trenches 180 are formed between the semiconductor nanostructures 107 of adjacent transistors 103. In FIG. 4A, the isolation structures 122 have a different composition than shown in FIG. 1O or FIG. 2A. However, in practice, the isolation structures 122 of FIG. 4A can be the same as the isolation structures 122 of FIG. 1O or FIG. 2A.

Figure 4B:
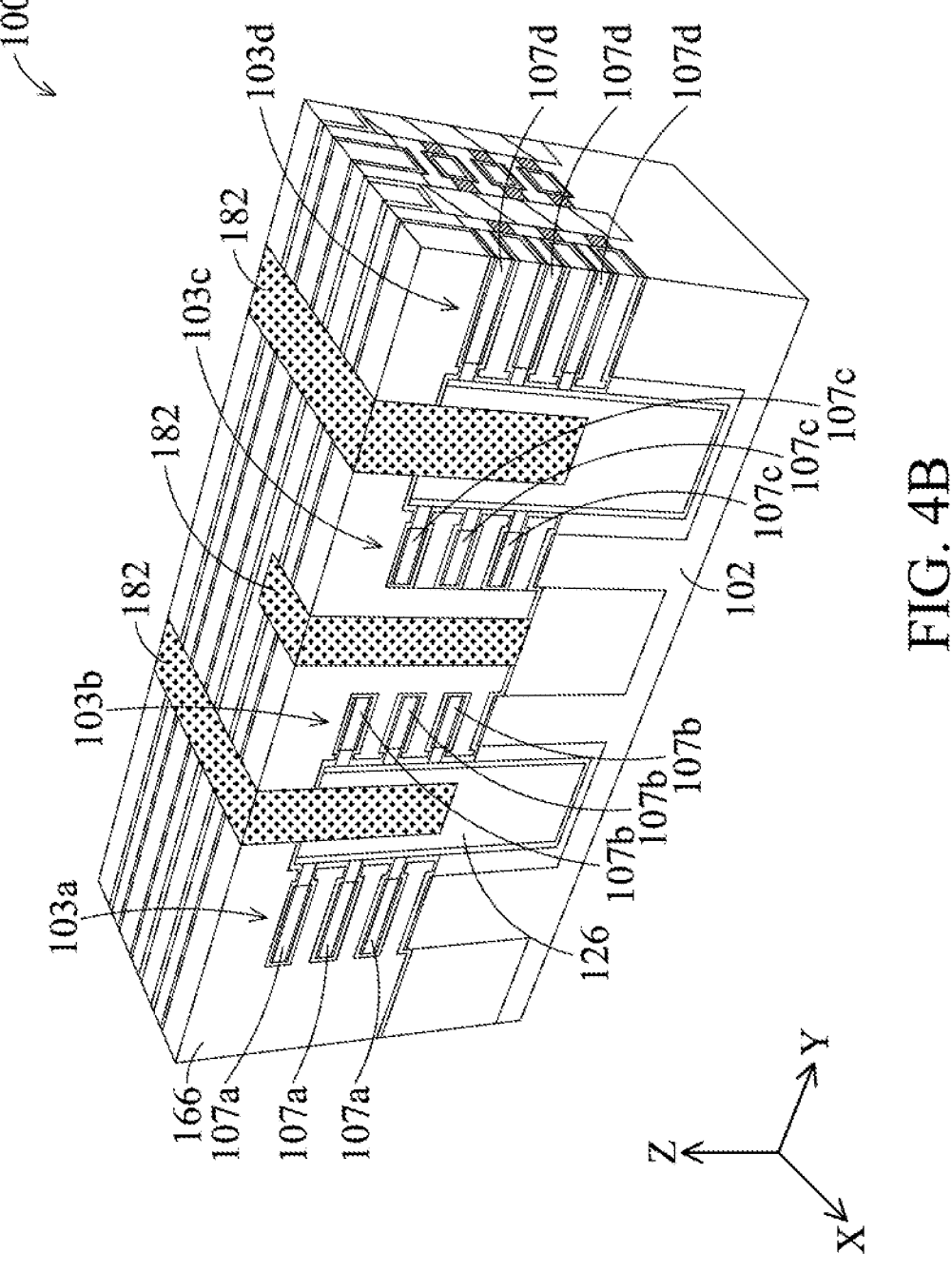

In FIG. 4B, the trenches 180 has been filled with a dielectric material 182. The dielectric material 182 can include one or more of SiO, SiN, SiON, SiOC, SiOCN, or other suitable dielectric materials. The dielectric material 182 extends from a top surface of the gate metal 166 downward into the core dielectric layer 126 to a level lower than the lowest semiconductor nanostructures 107. In some embodiments, the dielectric material 182 does not extend to a vertical level lower than a top of the substrate 102. The dielectric material 182 can have various configurations without departing from the scope of the present disclosure. The dielectric material 182 can be deposited by CVD, ALD, PVD, or other suitable deposition processes. After formation of the dielectric material 182, a CMP process can be performed to planarize the top surface of the integrated circuit 100.

Figure 4C:
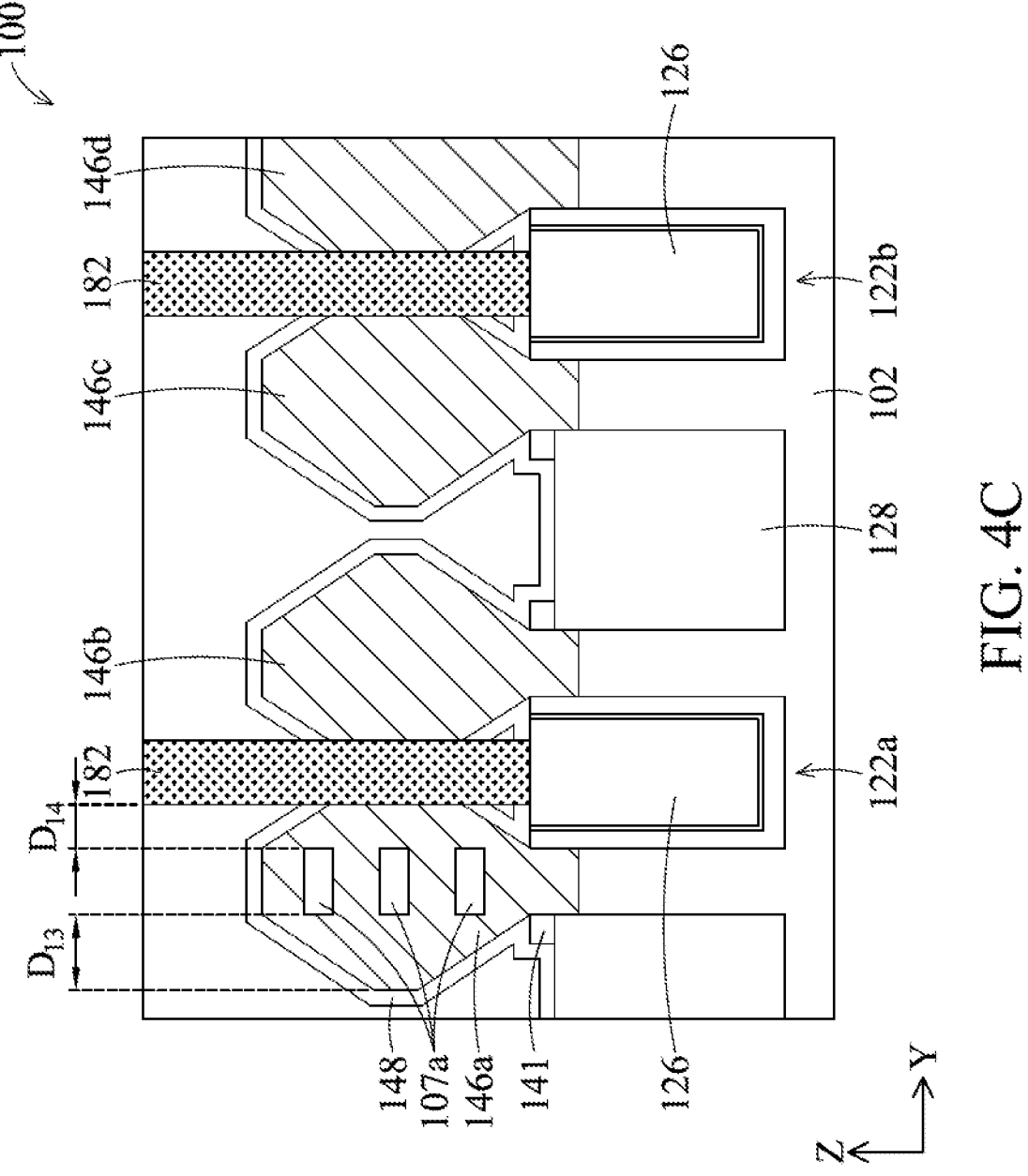

FIG. 4C is a cross-sectional view of the integrated circuit 100 taken further along the X direction such that the source/drain regions 146 are visible. The view of FIG. 4C illustrates that the trenches 180 pass through the source/drain regions 146 and the dielectric layer 148. In particular, the dielectric material 182 is in contact with the source/drain regions 146 and the dielectric layer 148. Formation of the trenches 180 renders the source/drain regions 146 asymmetrical. The trenches 180 and the dielectric material 182 can act as isolation between adjacent source/drain regions 146. In particular, the source/drain regions 146 have a lateral extent dimension D13 from an edge of the semiconductor nanostructure 107 on the side closest to the dielectric support element 141. The source/drain regions 146 have a lateral extent dimension D14 from the edge of the semiconductor nanostructures 107 on the side closest to the isolation structures 122. In some embodiments, D13 is between 10 nm and 20 nm. D14 is between 5 nm and 10 nm. D14 is smaller than D13. This is different than the source/drain regions 146 of FIG. 1J, in which D13 and D14 are substantially identical and the source/drain regions are substantially symmetrical. Other dimensions and configurations can be utilized without departing from the scope of the present disclosure.

Figure 4D:
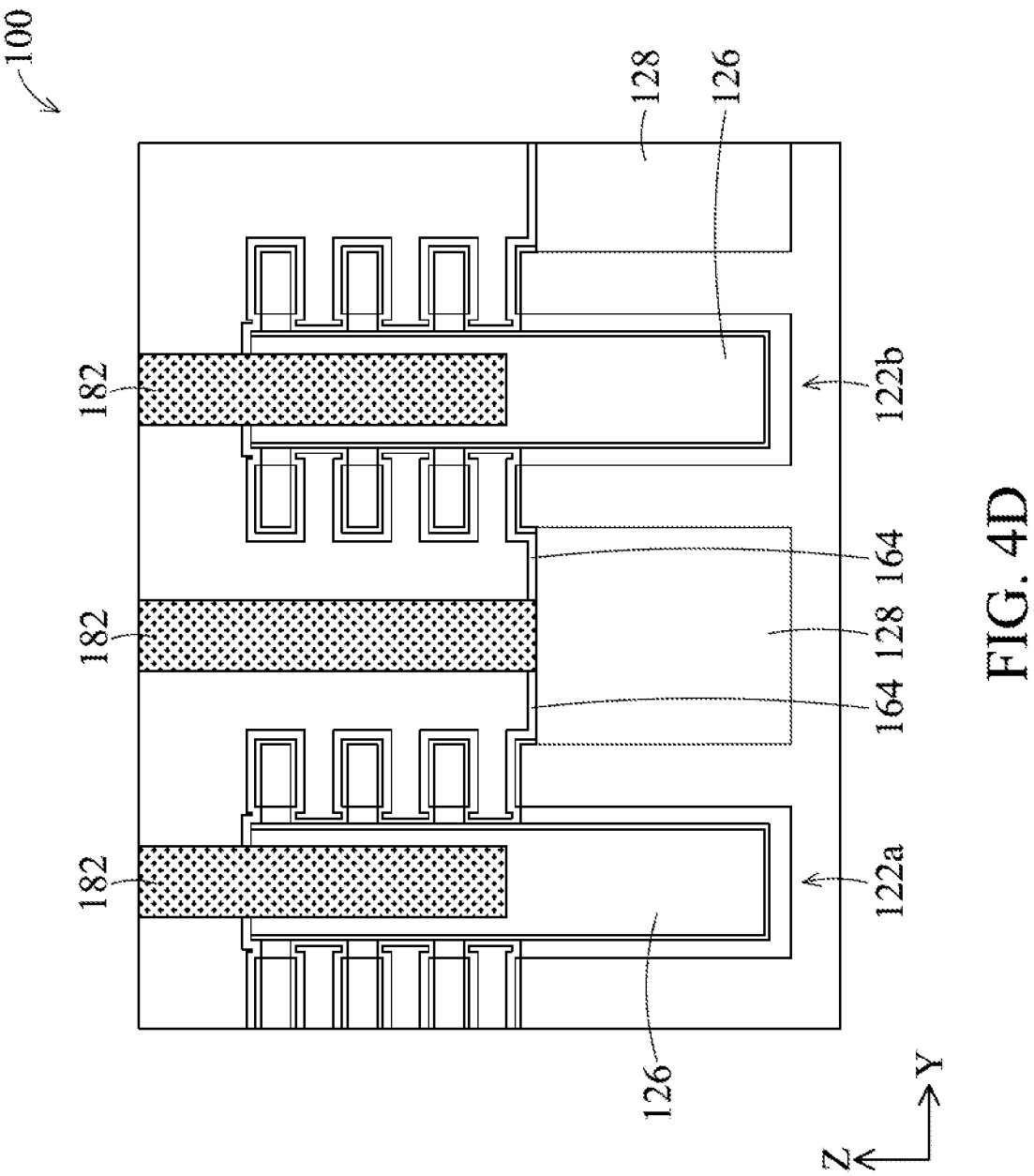

FIG. 4D is a cross-sectional view of the integrated circuit 100 at the same stage of processing as FIG. 1B, in accordance with some embodiments. FIG. 4D clearly illustrates how the dielectric material 182 extends downward into the core dielectric layer 126 and stops substantially on the surface of the trench isolation structures 128. Accordingly, the trenches 180 cut through the high-K dielectric layer 164 but do not substantially capture the trench isolation regions 128. Other configurations of trenches 180 and the dielectric material 182 can be utilized without departing from the scope of the present disclosure.

FIG. 5 is a flow diagram of a method 500 for forming an integrated circuit, in accordance with some embodiments. The method 500 can utilize the structures, processes, and systems described in relation to FIGS. 1A-4D. At 502, the method 500 includes forming, between stacked first semiconductor nanostructures of a first transistor and stacked second semiconductor nanostructures of a second transistor, an isolation structure including a core dielectric layer having a top surface higher than all of the stacked first and second semiconductor nanostructures and a shell dielectric layer surrounding a lower portion of the core dielectric layer and having a top surface lower than all of the stacked first and second semiconductor nanostructures. One example of a first transistor is the first transistor 103a of FIG. 1O. One example of first semiconductor nanostructures are the first semiconductor nanostructures 107a of FIG. 1O. One example of a second transistor is the second transistor 103b of FIG. 1O. One example of second semiconductor nanostructures are the second semiconductor nanostructures 107b of FIG. 1O. One example of an isolation structure is the isolation structure 122a of FIG. 1O. One example of a core dielectric layer is the core dielectric layer 126 of FIG. 1O. One example of a shell dielectric layer is the shell dielectric layer 124 of FIG. 1O. At 504, the method 500 includes forming an interfacial gate dielectric layer in contact with the stacked first and second semiconductor nanostructures. One example of an interfacial dielectric layer is the interfacial dielectric layer 162 of FIG. 1O. At 506, the method 500 includes forming a high-K gate dielectric layer in contact with the interfacial dielectric layer and sidewalls of the core dielectric layer. One example of a high-K gate dielectric layer is the high-K gate dielectric layer 164 of FIG. 1O.

Embodiments of the disclosure reduce active area spacing, and improve scaling of integrated circuit cell dimensions (e.g., height). In some embodiments, an isolation structure is formed between adjacent stacks of semiconductor nanostructures corresponding to channel regions of adjacent transistors. The isolation structures may have a shell dielectric layer and a core dielectric layer. Initially, the shell dielectric layer is in contact with sides of the semiconductor nanostructures. However, an etching process fully removes the shell dielectric layer from between the core dielectric layer and the semiconductor nanostructures. Subsequently, a high-K gate dielectric layer is conformally deposited on the surfaces of the semiconductor nanostructures and the core dielectric layer. The result is that the high-K gate dielectric layer entirely fills the spaces between the semiconductor nanostructures and the core dielectric layer. This can help control the profile of subsequently deposited gate metal can help prevent undesirable overlap between the gate metal and the source/drain regions. The result is improved wafer yields and integrated circuits with improved performance.

In one embodiment, a device includes a semiconductor substrate, a first transistor including a plurality of first stacked channels over the semiconductor substrate, a second transistor including a plurality of second stacked channels over the semiconductor substrate, and an isolation structure including a core dielectric layer between the first stacked channels and the second stacked channels. The device includes a high-K gate dielectric layer on the first and second stacked channels and on sidewalls of the core dielectric layer between the first stacked channels and the core dielectric layer and between the second stacked channels and the core dielectric layer.

In one embodiment, a method includes forming, between stacked first semiconductor nanostructures of a first transistor and stacked second semiconductor nanostructures of a second transistor, an isolation structure. The isolation structure includes a core dielectric layer having a top surface higher than all of the stacked first and second semiconductor nanostructures and a shell dielectric layer surrounding a lower portion of the core dielectric layer and having a top surface lower than all of the stacked first and second semiconductor nanostructures. The method includes forming a high-K gate dielectric layer in contact with sidewalls of the core dielectric layer.

In one embodiment, a device includes a semiconductor substrate, a first transistor including a plurality of stacked first semiconductor nanostructures over the semiconductor substrate corresponding to channel regions of the first transistor. The device includes a second transistor including a plurality of stacked second semiconductor nanostructures over the semiconductor substrate corresponding to channel regions of the second transistor. The device includes an isolation structure including a core dielectric layer between the stacked first semiconductor nanostructures and the stacked second semiconductor nanostructures and having a top surface higher than all of the first and second semiconductor nanostructure. The isolation structure includes a shell dielectric layer having a primary portion surrounding a lower region of the core dielectric layer and having a top surface lower than all of the stacked first and second semiconductor nanostructures, and a plurality of remnant portions each between the core dielectric layer and a respective one of the stacked first and second semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a semiconductor substrate;
   a first transistor including a plurality of first stacked channels over the substrate;
   a second transistor including a plurality of second stacked channels over the substrate;
   an isolation structure including a core dielectric layer between the first stacked channels and the second stacked channels; and
   a high-K gate dielectric layer on the first and second stacked channels and on sidewalls of the core dielectric layer between the first stacked channels and the core dielectric layer and between the second stacked channels and the core dielectric layer,
   an interfacial gate dielectric layer between the high-K dielectric layer and the first stacked channels, wherein the high-K gate dielectric layer and the interfacial dielectric layer entirely fill a space between at least one of the first stacked channels and the core dielectric layer.

2. The device of claim 1, wherein the core dielectric layer extends vertically higher than all of the first and second stacked channels and lower than a top surface of the semiconductor substrate.

3. The device of claim 2, wherein the isolation structure includes a shell dielectric layer surrounding a lower portion of the core dielectric layer, wherein the shell dielectric layer does not extend as high as the core dielectric layer.

4. The device of claim 3, wherein a top surface of the shell dielectric layer is lower than a top surface of the semiconductor substrate.

5. The device of claim 4, wherein the high-K gate dielectric layer is in contact with a top surface of the shell dielectric layer.

6. The device of claim 1, comprising a gate metal on the high-K gate dielectric layer above and below the first and second stacked channels, wherein the high-K gate dielectric forms a corner adjacent to one of the first stacked channels and the core dielectric layer, wherein the gate metal includes a corner portion in contact with the corner portion of the high-K gate dielectric.

7. The device of claim 6, wherein the corner portion of the gate metal is positioned between at least one of the first stacked channels and the core dielectric layer.

8. The device of claim 6, wherein the corner portion of the gate metal is substantially at a same vertical level as a top surface of the adjacent first stacked channel.

9. The device of claim 1, wherein the interfacial gate dielectric layer has same thickness on a side of one of the first stacked channels adjacent to the core dielectric layer as on a second side of the one of the first stacked channels distal from the core dielectric layer.

10. A method, comprising:
   forming, between stacked first semiconductor nanostructures of a first transistor and second stacked semiconductor nanostructures of a second transistor, an isolation structure including:
   a core dielectric layer having a top surface higher than all of the first and second semiconductor nanostructures; and
   a shell dielectric layer surrounding a lower portion of the core dielectric layer and having a top surface lower than all of the first and second semiconductor nanostructures; and
   forming a high-K gate dielectric layer in contact with the sidewalls of the core dielectric layer;
   forming the shell dielectric layer on sidewalls of the first and second semiconductor nanostructures and having the top surface higher than all of the first and second semiconductor nanostructures; and
   etching the shell dielectric layer to remove shell dielectric layer from the sidewalls of the first and second semiconductor nanostructures and to recess the top surface of the shell dielectric layer to a level below all of the first and second semiconductor nanostructures;
   forming an interfacial dielectric layer in contact with the first and second semiconductor nanostructures, wherein forming the high-K gate dielectric layer includes depositing a first portion of the high-K gate dielectric on the interfacial dielectric layer and depositing a second portion of the high-K gate dielectric layer on the core dielectric layer where the shell dielectric layer was removed, wherein forming the high-K gate dielectric layer includes growing the high-K gate dielectric such that the first portion of the high-K gate dielectric merges with the second portion of the high-K gate dielectric.

11. The method of claim 10, comprising depositing a gate metal above and below the first and second semiconductor nanostructures and in contact with the first and second portions of the high-K gate metal.

12. The method of claim 11, wherein the gate metal includes a corner portion in contact with the first and second portions of the high-K gate dielectric layer at corner region of the high-K gate dielectric, wherein the corner portion is substantially at a same level as a top surface of a highest first semiconductor nanostructure.

13. The method of claim 12, wherein the gate metal includes a corner portion in contact with the first and second portions of the high-K gate dielectric layer at corner region of the high-K gate dielectric, wherein the corner portion is lower than a top surface of a highest first semiconductor nanostructure.

14. A device, comprising:
   a semiconductor substrate;

a first transistor including a plurality of stacked first semiconductor nanostructures over the substrate corresponding to channel regions of the first transistor;

a second transistor including a plurality of stacked second semiconductor nanostructures over the substrate corresponding to channel regions of the second transistor;

an isolation structure including:

a core dielectric layer between the first semiconductor nanostructures and the second semiconductor nanostructures and having a top surface higher than all of the first and second semiconductor nanostructure; and a shell dielectric layer having:

a primary portion surrounding a lower region of the core dielectric layer and having a top surface lower than all of the first and second semiconductor nanostructures; and a plurality of remnant portions each between the core dielectric layer and a respective one of the first and second semiconductor nanostructures.

15. The device of claim 14, wherein the shell dielectric layer includes a first shell dielectric layer directly on the core dielectric layer and a second shell dielectric layer directly on the first shell dielectric layer.

16. The device of claim 15, comprising a gate dielectric layer on the first and second semiconductor nanostructures and on top surfaces of the remnant portions of the shell dielectric layer.

17. The device of claim 14, comprising a gate metal on the high-K gate dielectric layer above and below the first and second stacked channels.

18. The device of claim 17, wherein the high-K gate dielectric forms a corner adjacent to one of the first stacked semiconductor nanostructures and the core dielectric layer, wherein the gate metal includes a corner portion in contact with the corner portion of the high-K gate dielectric.

19. The device of claim 18, wherein the corner portion of the gate metal is positioned between at least one of the first stacked semiconductor nanostructures and the core dielectric layer.

20. The device of claim 19, wherein the corner portion of the gate metal is substantially at a same vertical level as a top surface of the adjacent first stacked semiconductor nanostructure.

* * * * *